(12) United States Patent
Horikoshi

(10) Patent No.: US 12,389,705 B2
(45) Date of Patent: Aug. 12, 2025

(54) SEMICONDUCTOR DEVICE, SOLID-STATE IMAGING DEVICE AND ELECTRONIC DEVICE

(71) Applicant: SONY SEMICONDUCTOR SOLUTIONS CORPORATION, Kanagawa (JP)

(72) Inventor: Hiroshi Horikoshi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 381 days.

(21) Appl. No.: 17/755,848

(22) PCT Filed: Sep. 30, 2020

(86) PCT No.: PCT/JP2020/037338
§ 371 (c)(1),
(2) Date: May 10, 2022

(87) PCT Pub. No.: WO2021/100332
PCT Pub. Date: May 27, 2021

(65) Prior Publication Data
US 2022/0406834 A1    Dec. 22, 2022

(30) Foreign Application Priority Data
Nov. 19, 2019    (JP) .................. 2019-208612

(51) Int. Cl.
*H01L 21/78*    (2006.01)
*H01G 4/008*    (2006.01)
(Continued)

(52) U.S. Cl.
CPC ........... *H10F 39/811* (2025.01); *H01G 4/008* (2013.01); *H01G 4/30* (2013.01); *H04N 23/54* (2023.01);
(Continued)

(58) Field of Classification Search
CPC ......... H01L 27/14636; H01L 27/14603; H01L 28/60; H01L 21/3205; H01L 21/768;
(Continued)

(56) References Cited

U.S. PATENT DOCUMENTS 6,680,521 B1 *   1/2004   Kar-Roy ................. H01L 28/40
                                                                 257/532
7,317,221 B2 *   1/2008   Chang ................. H01L 27/0805
                                                                 257/532
(Continued)

FOREIGN PATENT DOCUMENTS

CN    103258829 A    8/2013
CN    104425533 A    3/2015
(Continued)

OTHER PUBLICATIONS

International Search Report and Written Opinion of PCT Application No. PCT/JP2020/037338, issued on Dec. 8, 2020, 09 pages of ISRWO.

(Continued)

*Primary Examiner* — Vu A Vu
(74) *Attorney, Agent, or Firm* — CHIP LAW GROUP

(57) ABSTRACT

A semiconductor device includes a first electrode which is provided in a first substrate and of which one surface is positioned on the same surface as a bonding surface between the first substrate and a second substrate, and a second electrode which is provided in the second substrate and of which one surface is positioned on the same surface as a bonding surface and bonded to one surface of the first electrode. Therefore, the semiconductor device includes at least one of a first capacitor which is provided in the first substrate and of which one electrode is electrically connected to a non-exposed surface of the first electrode and a second capacitor which is provided in the second substrate (Continued)

and of which one electrode is electrically connected to a non-exposed surface of the second electrode.

12 Claims, 29 Drawing Sheets

(51) Int. Cl.
  *H01G 4/30* (2006.01)
  *H04N 23/54* (2023.01)
  *H04N 25/59* (2023.01)
  *H04N 25/77* (2023.01)
  *H04N 25/79* (2023.01)
  *H10D 1/68* (2025.01)
  *H10F 39/00* (2025.01)

(52) U.S. Cl.
  CPC .............. *H04N 25/59* (2023.01); *H04N 25/77* (2023.01); *H04N 25/79* (2023.01); *H10D 1/692* (2025.01); *H10F 39/802* (2025.01)

(58) Field of Classification Search
  CPC ................. H01L 23/522; H01L 27/146; H01L 27/14601; H01L 28/40; H01G 4/008; H01G 4/30; H01G 4/33; H04N 23/54; H04N 25/59; H04N 25/77; H04N 25/79; H04N 25/771; H04N 25/78; H04N 23/55
  USPC ....................................................... 257/291
  See application file for complete search history.

(56) References Cited

U.S. PATENT DOCUMENTS

| | | | | |
|---|---|---|---|---|
| 7,884,409 B2* | 2/2011 | Kim | ........................ | H01L 28/60 257/532 |
| 8,792,034 B2* | 7/2014 | Takahashi | ......... | H01L 27/14636 348/297 |
| 9,012,292 B2* | 4/2015 | Lee | ........................ | H10B 12/09 257/E21.09 |
| 9,385,079 B2* | 7/2016 | Chang | .................. | H01L 23/5286 |
| 10,515,949 B2* | 12/2019 | Chen | .................... | H01L 23/5228 |
| 11,462,541 B2* | 10/2022 | Alzate Vinasco | .. | H01L 27/0688 |
| 2013/0214371 A1 | 8/2013 | Asatsuma et al. | | |
| 2015/0060968 A1 | 3/2015 | Sa et al. | | |
| 2016/0020235 A1* | 1/2016 | Yamashita | ........ | H01L 27/14634 250/206 |
| 2019/0363129 A1 | 11/2019 | Yokoyama et al. | | |

FOREIGN PATENT DOCUMENTS

| | | |
|---|---|---|
| CN | 110168725 A | 8/2019 |
| DE | 112017006868 T5 | 10/2019 |
| JP | 2011-166171 A | 8/2011 |
| JP | 2013161945 A | 8/2013 |
| JP | 2013168623 A | 8/2013 |
| JP | 2013-207321 A | 10/2013 |
| JP | 2015-050463 A | 3/2015 |
| JP | 2018-117102 A | 7/2018 |
| KR | 10-1334213 B1 | 11/2013 |
| KR | 10-2019-0105575 A | 9/2019 |
| TW | I511276 B | 12/2015 |
| TW | 201841344 A | 11/2018 |
| WO | 2018/135194 A1 | 7/2018 |

OTHER PUBLICATIONS

Decision to Grant a Patent issued in Chinese Application No. 202080073130.1 dated Jun. 2, 2025.

* cited by examiner

SEMICONDUCTOR DEVICE, SOLID-STATE IMAGING DEVICE AND ELECTRONIC DEVICE

CROSS REFERENCE TO RELATED APPLICATIONS

This application is a U.S. National Phase of International Patent Application No. PCT/JP2020/037338 filed on Sep. 30, 2020, which claims priority benefit of Japanese Patent Application No. JP 2019-208612 filed in the Japan Patent Office on Nov. 19, 2019. Each of the above-referenced applications is hereby incorporated herein by reference in its entirety.

TECHNICAL FIELD

The present technology relates to a semiconductor device, a solid-state imaging device and an electronic device.

BACKGROUND ART

In the related art, a semiconductor device including a first substrate and a second substrate bonded to the first substrate and in which, on a bonding surface between the first substrate and the second substrate, a first connection electrode formed on the first substrate and a second connection electrode formed on the second substrate are electrically connected has been proposed (for example, refer to PTL 1). In the semiconductor device described in PTL 1, an insulating film is arranged between the second connection electrode and a metal wiring provided in the second substrate to form a capacitor.

CITATION LIST

Patent Literature

[PTL 1]
JP 2011-166171 A

SUMMARY

Technical Problem

Incidentally, generally, when the first substrate and the second substrate are bonded, warp correction is performed on the first substrate and the second substrate, but stress is applied to the capacitor by the warp correction. In addition, stress is also applied to the capacitor due to the difference in the coefficient of thermal expansion between the second connection electrode and the insulating film. Here, in the semiconductor device described in PTL 1, since the position of the capacitor is close to the bonding surface and a contact area between the insulating film constituting the capacitor and the metal wiring is large, stress due to the bonding process is directly applied to the capacitor. Therefore, for example, insulating film cracks, variations in the polarization state of the insulating film, and the like may occur, and the performance of the capacitor may deteriorate.

An object of the present disclosure is to provide a semiconductor device, a solid-state imaging device and an electronic device through which it is possible to minimize deterioration of performance of a capacitor due to a bonding process.

Solution to Problem

A semiconductor device of the present disclosure includes (a) a first substrate, (b) a second substrate bonded to the first substrate, (c) a first electrode which is provided in the first substrate and of which one surface is positioned on the same surface as a bonding surface between the first substrate and the second substrate, (d) a second electrode which is provided in the second substrate and of which one surface is positioned on the same surface as the bonding surface and bonded to one surface of the first electrode, and (e) at least one of a first capacitor which is provided in the first substrate and of which one electrode is electrically connected to the other surface of the first electrode and a second capacitor which is provided in the second substrate and of which one electrode is electrically connected to the other surface of the second electrode.

A solid-state imaging device of the present disclosure includes a sensor substrate in which a plurality of photoelectric conversion units are arranged, a logic substrate which is bonded to the sensor substrate and in which a circuit that processes an electrical signal from the photoelectric conversion unit is integrated, a first electrode which is provided in the sensor substrate and of which one surface is positioned on the same surface as a bonding surface between the sensor substrate and the logic substrate, a second electrode which is provided in the logic substrate and of which one surface is positioned on the same surface as the bonding surface and bonded to one surface of the first electrode, and at least one of a first capacitor which is provided in the sensor substrate and of which one electrode is electrically connected to the other surface of the first electrode and a second capacitor which is provided in the logic substrate and of which one electrode is electrically connected to the other surface of the second electrode.

An electronic device of the present disclosure includes a solid-state imaging device including a sensor substrate in which a plurality of photoelectric conversion units are arranged, a logic substrate which is bonded to the sensor substrate and in which a circuit that processes an electrical signal from the photoelectric conversion unit is integrated, a first electrode which is provided in the sensor substrate and of which one surface is positioned on the same surface as a bonding surface between the sensor substrate and the logic substrate, a second electrode which is provided in the logic substrate and of which one surface is positioned on the same surface as the bonding surface and bonded to one surface of the first electrode, and at least one of a first capacitor which is provided in the sensor substrate and of which one electrode is electrically connected to the other surface of the first electrode and a second capacitor which is provided in the logic substrate and of which one electrode is electrically connected to the other surface of the second electrode, an optical lens that forms image light from a subject into an image on an imaging surface of the solid-state imaging device, and a signal processing circuit that performs signal processing on a signal output from the solid-state imaging device.

DESCRIPTION OF EMBODIMENTS

Hereinafter, an example of a semiconductor device according to an embodiment of the present disclosure will be described with reference to FIG. 1 to FIG. 31. The embodiment of the present disclosure will be described in the following order. Here, the present disclosure is not limited to the following examples. In addition, the effects described in this specification are exemplary and not limiting, and other effects may be provided.

Figure 1:
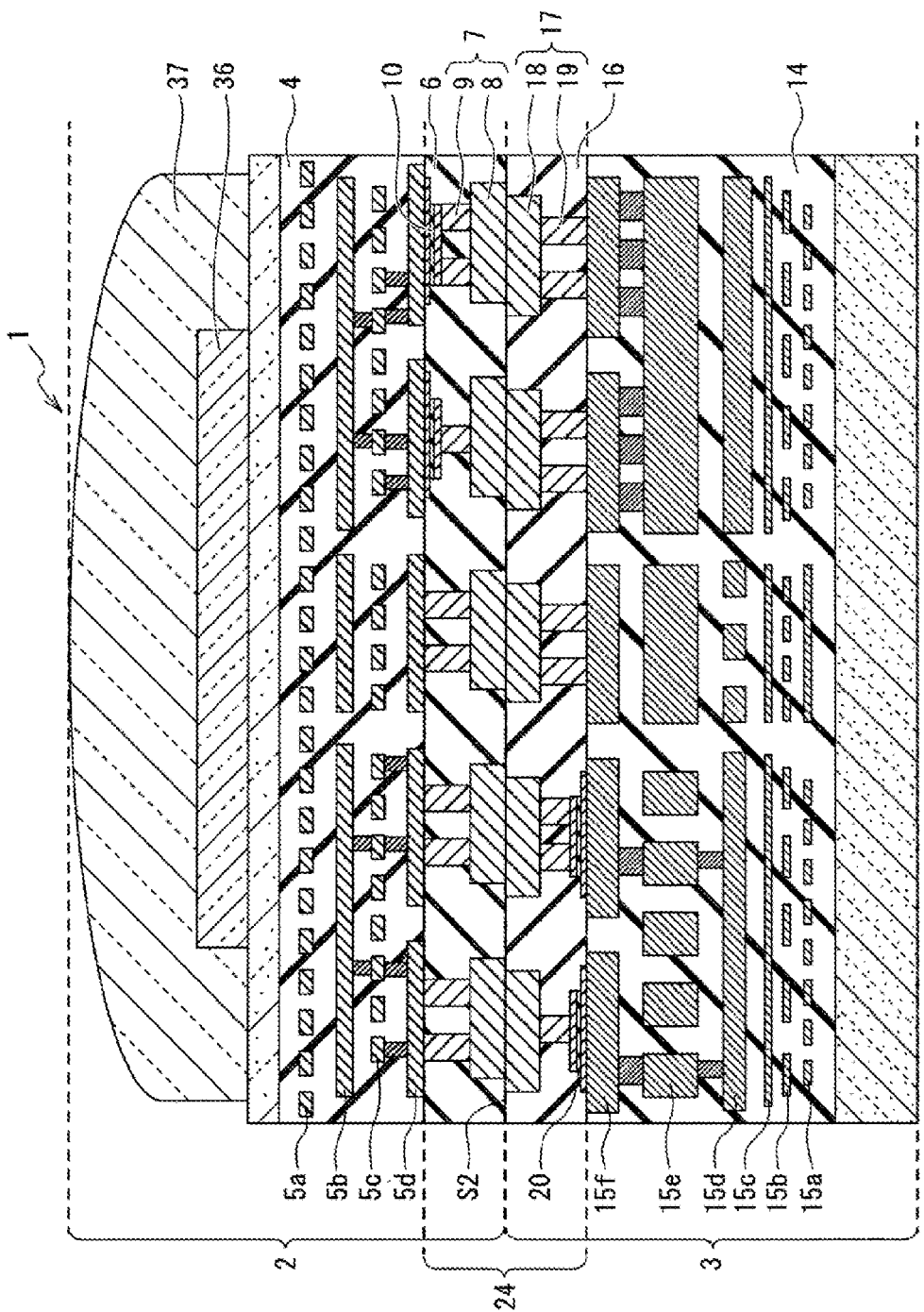
FIG. 1 is a cross-sectional view showing an overall structure of a semiconductor device according to a first embodiment.

1. First embodiment: semiconductor device
1-1 Configuration of semiconductor device
1-2 Method of producing semiconductor device
1-3 Modification example
2. Example of application to solid-state imaging device
2-1 Configuration of solid-state imaging device
2-2 Configuration of main part
2-3 Modification example
3. Example of application to electronic device
4. Example of application to moving object
5. Example of application to endoscopic surgery system 1. First Embodiment 1-1 Configuration of Semiconductor Device As shown in FIG. 1, a semiconductor device 1 according to a first embodiment includes a first substrate 2 and a second substrate 3 bonded to the first substrate 2. As the first substrate 2, for example, a sensor substrate in which a plurality of photoelectric conversion units are arranged can be used. In addition, as the second substrate 3, for example, a logic substrate in which circuits for processing electrical signals from photoelectric conversion units are integrated can be used. In addition, as a method of bonding the first substrate 2 to the second substrate 3, for example, plasma bonding can be used.

An interlayer insulating film 4 is provided on the first substrate 2 on the side of the second substrate 3 (in FIG. 1, the lower side). The interlayer insulating film 4 has a plurality of wiring layers therein. FIG. 1 illustrates an example in which four layers: a first wiring layer 5a, a second wiring layer 5b, a third wiring layer 5c and a fourth wiring layer 5d, are included as a plurality of wiring layers. That is, in FIG. 1, the interlayer insulating film 4, the first wiring layer 5a, the second wiring layer 5b, the third wiring layer 5c and the fourth wiring layer 5d form a multilayer wiring layer. Here, the number of wiring layers shown in FIG. 1 is an example, and the number of wiring layers included in the interlayer insulating film 4 may be a number other than 4.

Although details are omitted, each of the first wiring layer 5a, the second wiring layer 5b, the third wiring layer 5c and the fourth wiring layer 5d is electrically connected to an element or the like provided in the first substrate 2.

Figure 2:
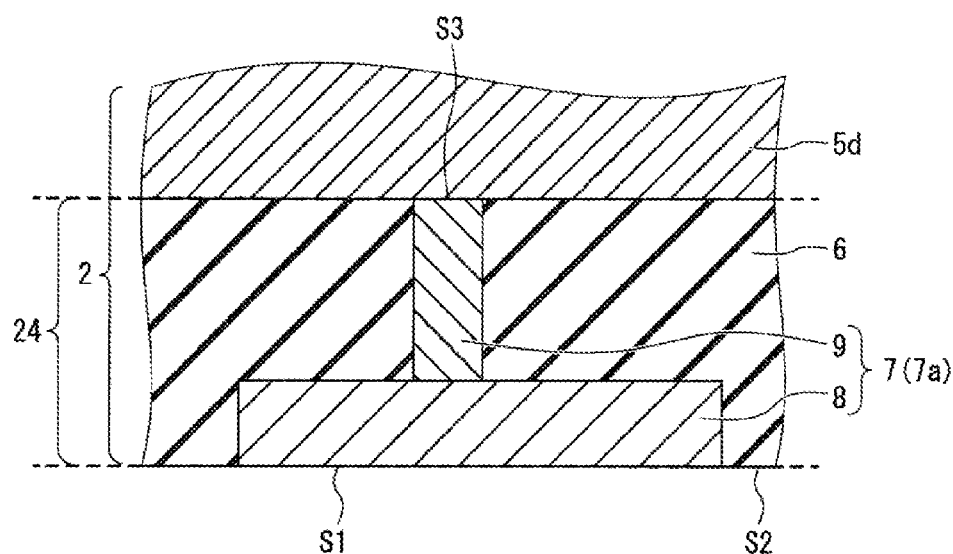
FIG. 2 is a cross-sectional view showing an enlarged first electrode.
Figure 3:
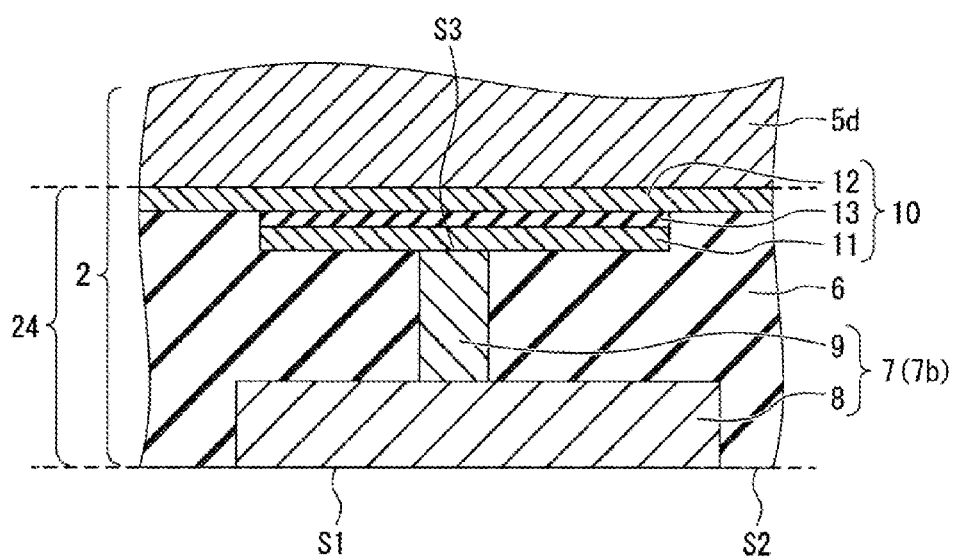
FIG. 3 is a cross-sectional view showing an enlarged first electrode.

In addition, an interlayer insulating film 6 is provided on the front surface of the interlayer insulating film 4 on the side of the second substrate 3 (in FIG. 1, the lower side). As shown in FIG. 2 and FIG. 3, in the interlayer insulating film 6, a plurality of first electrodes 7 which are provided in the interlayer insulating film 6 and of which one surface (hereinafter referred to as an "exposed surface S1") is positioned on the same surface as a bonding surface S2 between the first substrate 2 and the second substrate 3 are arranged. That is, the exposed surface S1 of the first electrode 7 is exposed from the front surface (the bonding surface S2) of the interlayer insulating film 6 on the side of the second substrate 3. As the first electrode 7, for example, a copper electrode made of pure copper or copper alloy can be used.

As shown in FIG. 1, FIG. 2 and FIG. 3, the first electrode 7 includes a flat first electrode pad 8 of which one surface (in FIG. 1 to FIG. 3, the front surface on the lower side) is positioned on the same surface as the bonding surface S2 and a columnar first via 9 extending from the other surface (in FIG. 1 to FIG. 3, the front surface on the upper side) of the first electrode pad 8 in a thickness direction (in FIG. 1 and FIG. 2, the upward direction) of the first substrate 2.

In addition, as shown in FIG. 2, the wiring of the fourth wiring layer 5d, that is, the wiring of the wiring layer closest to the side of the second substrate 3 (in FIG. 2, the lower side) is electrically connected to the other surface (hereinafter referred to as a "non-exposed surface S3") of a part of the first electrode 7 (hereinafter referred to as a "first electrode 7a") among the plurality of first electrodes 7. In addition, as shown in FIG. 3, among the plurality of first electrodes 7, the wiring of the fourth wiring layer 5d is electrically connected to the other surface (the non-exposed surface S3) of a part of the first electrodes 7 (a part or all of the first electrodes 7 other than the first electrode 7a; hereinafter referred to as a "first electrode 7b") with a first capacitor 10 provided in the interlayer insulating film 6 therebetween.

The first capacitor 10 includes two flat electrodes 11 and 12 that face each other and the insulating film 13 arranged between the two electrodes 11 and 12. The electrode 11 is arranged on the side of the second substrate 3 (in FIG. 3, the lower side), and the first electrode 7b is electrically connected thereto. In addition, the electrode 12 is arranged on the side opposite to the second substrate 3 side (in FIG. 3, the upper side), and the wiring of the fourth wiring layer 5d is electrically connected thereto. In addition, as the material of the electrodes 11 and 12, a conductor into which copper does not easily diffuse and which does not easily diffuse to the insulating film 13 is used. For example, high-melting-point metals such as tantalum (Ta), tantalum nitride (TaN), titanium (Ti), titanium nitride (TiN), tungsten nitride (WN), zirconium nitride (ZnN), and cobalt (Co), and high-melting-point metal nitrides may be exemplified. In addition, as the insulating film 13, for example, a single-layer film made of any of high-dielectric-constant insulating materials such as tantalum oxide (TaO), hafnium oxide (HfO), aluminum oxide (AlO), silicon nitride (SiN) and zirconium oxide (ZnO), or a multilayer film formed by combining these is used.

Referring back to FIG. 1, an interlayer insulating film 14 is provided on the second substrate 3 on the side of the first substrate 2 (in FIG. 1, the upper side). The interlayer insulating film 14 has a plurality of wiring layers therein. FIG. 1 illustrates an example in which a first wiring layer 15a, a second wiring layer 15b, a third wiring layer 15c, a fourth wiring layer 15d, a fifth wiring layer 15e and a sixth wiring layer 15f are included as a plurality of wiring layers. That is, in FIG. 1, the interlayer insulating film 14 and the first wiring layer 15a to the sixth wiring layer 15f form a multilayer wiring layer. Here, the number of wiring layers shown in FIG. 1 is an example, and the number of wiring layers included in the interlayer insulating film 14 may be a number other than 6. Although details are omitted, each of the first wiring layer 15a to the sixth wiring layer 15f is electrically connected to an element or the like provided in the second substrate 3.

Figure 4:
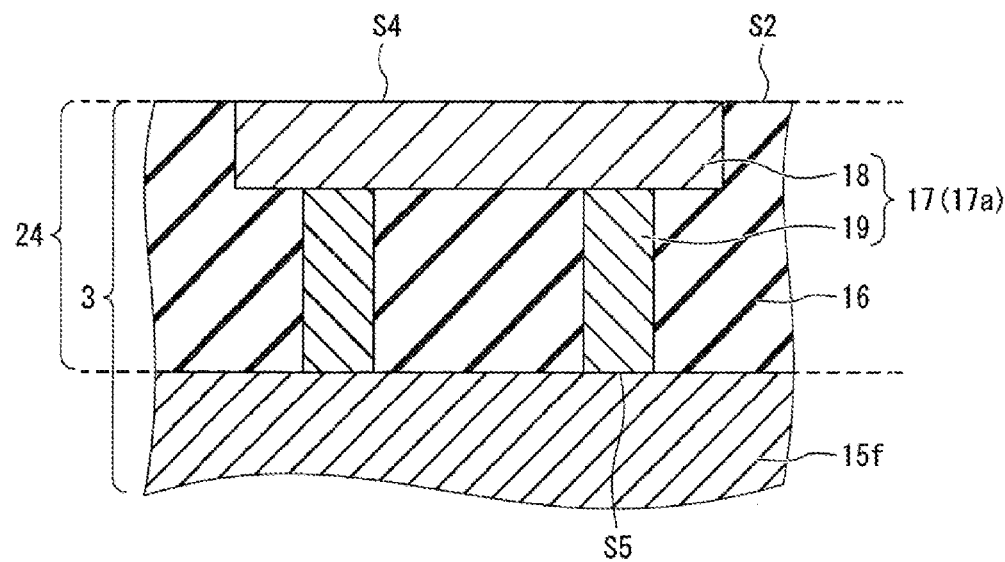
FIG. 4 is a cross-sectional view showing an enlarged second electrode.
Figure 5:
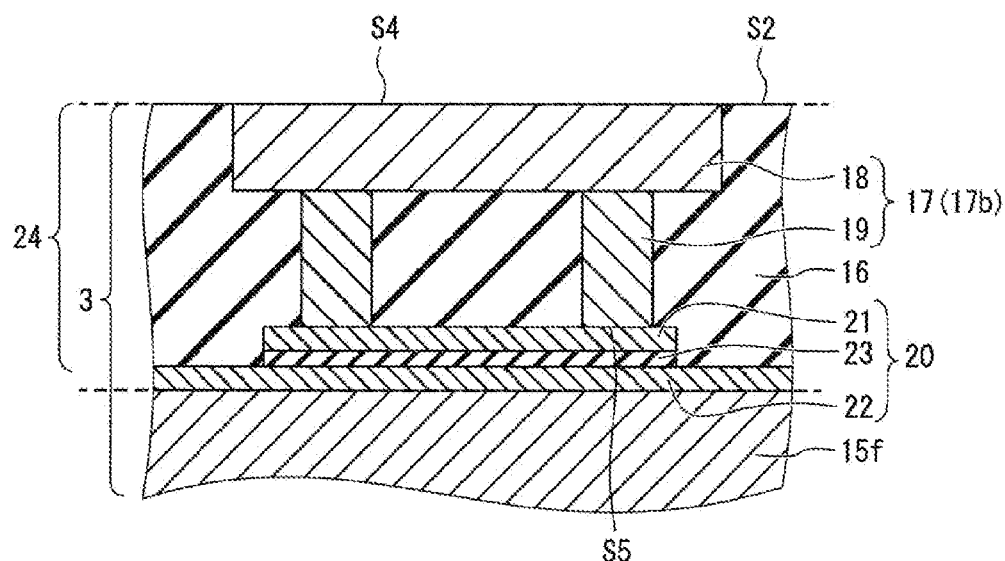
FIG. 5 is a cross-sectional view showing an enlarged second electrode.

In addition, an interlayer insulating film 16 is provided on the front surface of the interlayer insulating film 14 on the side of the first substrate 2 (in FIG. 1, the upper side). As shown in FIG. 4 and FIG. 5, in the interlayer insulating film 16, a plurality of second electrodes 17 which are provided in the interlayer insulating film 16 and of which one surface (hereinafter referred to as an "exposed surface S4") is positioned on the same surface as the bonding surface S2 are arranged. That is, the exposed surface S4 of the second electrodes 17 is exposed from the front surface (the bonding surface S2) of the interlayer insulating film 16 on the side of the first substrate 2. As the second electrode 17, for example, a copper electrode made of pure copper or copper alloy can be used.

As shown in FIG. 1, FIG. 4 and FIG. 5, the second electrode 17 includes a flat second electrode pad 18 of which one surface (in FIG. 1, FIG. 4 and FIG. 5, the front surface on the upper side) is positioned on the same surface as the bonding surface S2 and a columnar second via 19 extending from the other surface (in FIG. 1, FIG. 4 and FIG. 5, the front surface on the lower side) of the second electrode pad 18 in a thickness direction (in FIG. 1, FIG. 4 and FIG. 5, the downward direction) of the second substrate 3. The second electrode pad 18 is arranged on a surface object with the first electrode pad 8 and the bonding surface S2 interposed therebetween. That is, on the bonding surface S2, the first electrode pad 8 and the second electrode pad 18 are bonded to each other, and the interlayer insulating film 6 and the interlayer insulating film 16 are bonded to each other.

Figure 6:
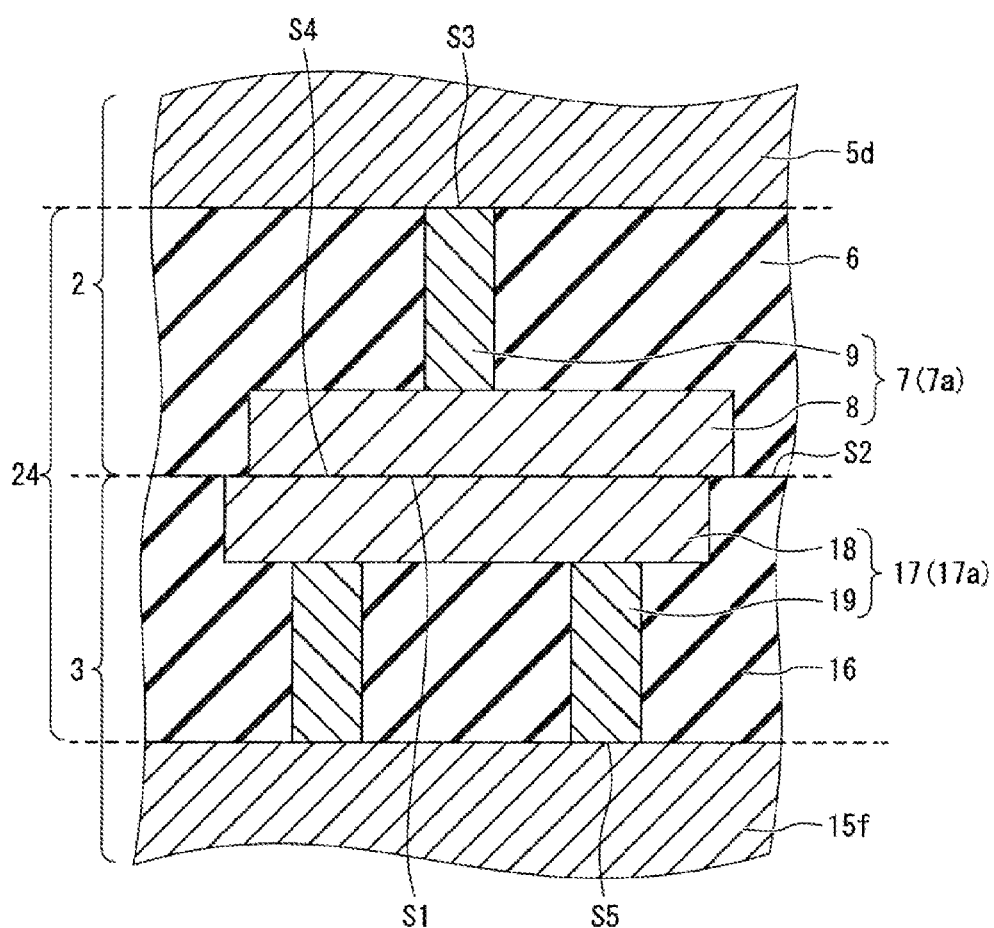
FIG. 6 is a cross-sectional view showing a first electrode and a second electrode bonded to each other.

In addition, as shown in FIG. 4, the wiring of the sixth wiring layer 15f, that is, the wiring of the wiring layer closest to the side of the first substrate 2 (in FIG. 4, the upper side) is electrically connected to the other surface (hereinafter referred to as a "non-exposed surface S5") of a part of the second electrode 17 (hereinafter referred to as a "second electrode 17a") among the plurality of second electrodes 17. The second electrode 17a is connected to the first electrode 7a connected to the wiring of the fourth wiring layer 5d or the first electrode 7b connected to the wiring of the fourth wiring layer 5d with the first capacitor 10 therebetween. As shown in FIG. 6, at a connection part between the second electrode 17a and the first electrode 7a, the wiring of the fourth wiring layer 5d of the first substrate 2 and the wiring of the sixth wiring layer 15f of the second substrate 3 are electrically connected with the first electrode 7a and the second electrode 17a therebetween. Therefore, it is possible to transmit a DC signal or supply DC power between the wiring of the fourth wiring layer 5d of the first substrate 2 and the wiring of the sixth wiring layer 15f of the second substrate 3.

Figure 7:
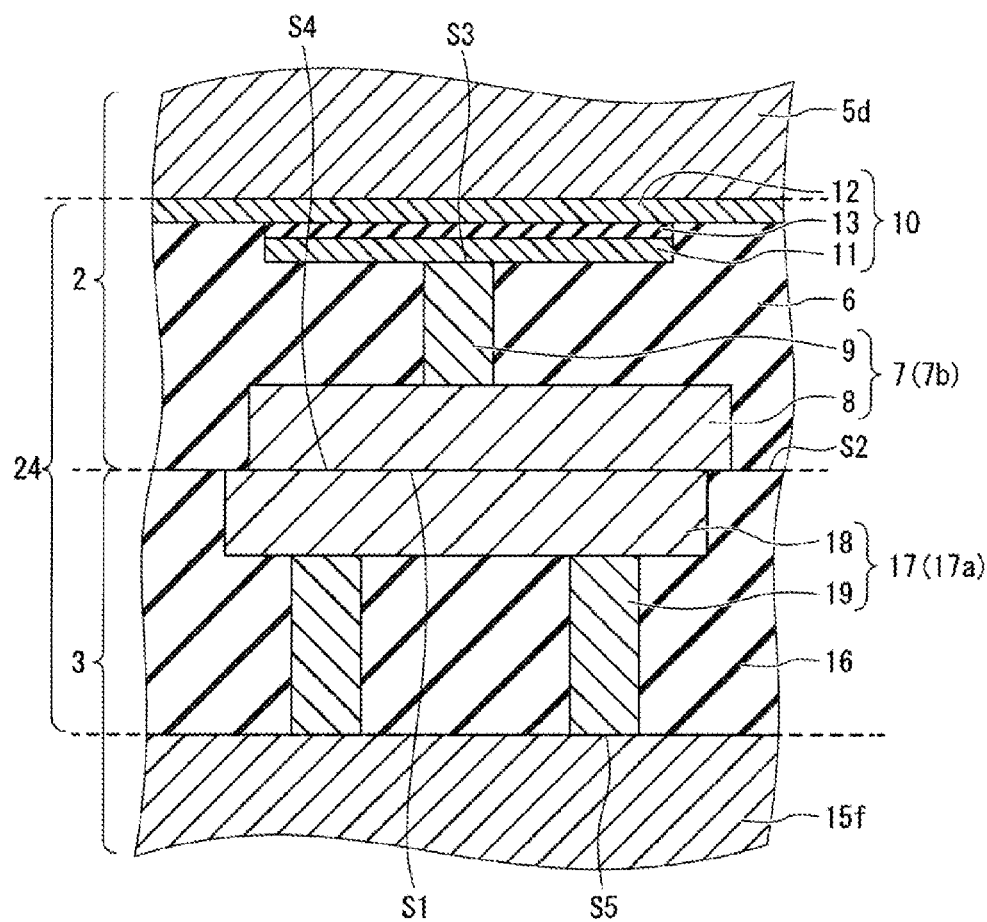
FIG. 7 is a cross-sectional view showing a first electrode and a second electrode bonded to each other.

On the other hand, as shown in FIG. 7, at a connection part between the second electrode 17a and the first electrode 7b, the wiring of the fourth wiring layer 5d of the first substrate 2 and the wiring of the sixth wiring layer 15f of the second substrate 3 are electrically connected with the first capacitor 10 therebetween in addition to the first electrode 7b and the second electrode 17a. Therefore, the charge of these wirings can be accumulated in the first capacitor 10. When the configuration of the connection part shown in FIG. 7 is realized, for example, either the wiring of the fourth wiring layer 5d or the wiring of the sixth wiring layer 15f electrically connected to the first capacitor 10 may be used as a ground wiring.

Figure 8:
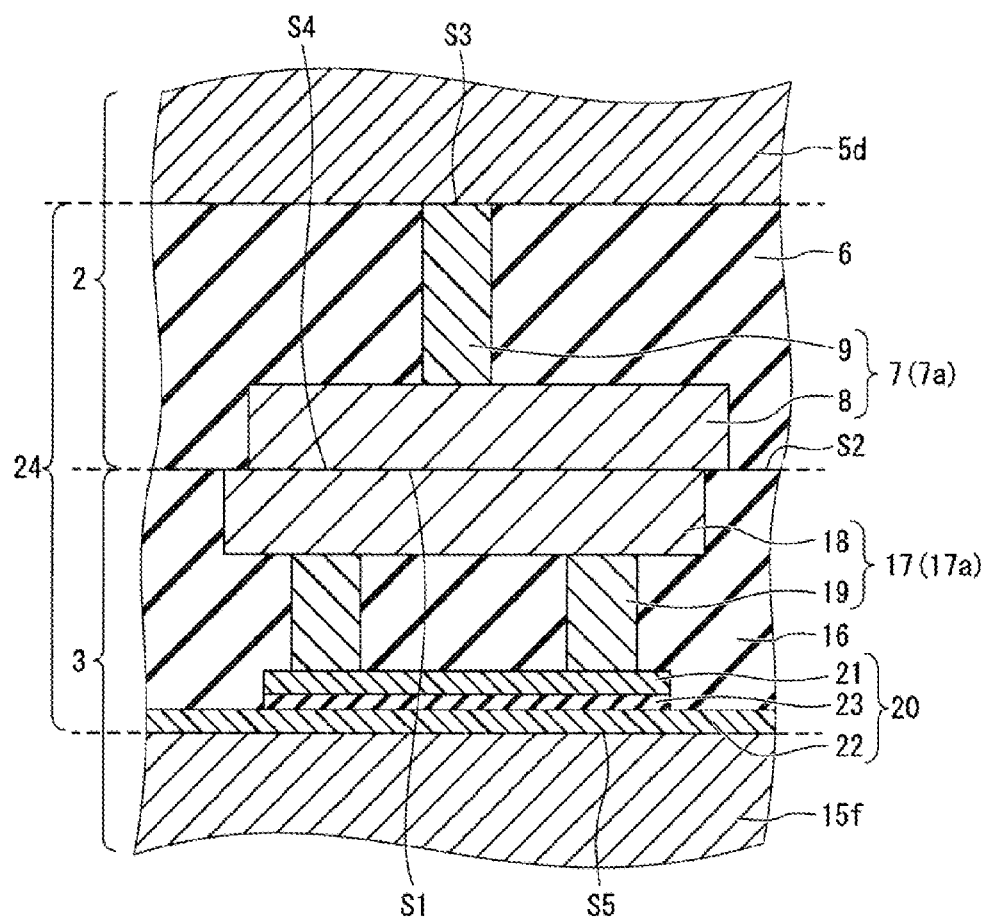
FIG. 8 is a cross-sectional view showing a first electrode and a second electrode bonded to each other.

In addition, as shown in FIG. 5, the wiring of the sixth wiring layer 15f is electrically connected to the other surface (the non-exposed surface S5) of a part of the second electrode 17 (a part or all of the second electrode 17 other than the second electrode 17a; hereinafter referred to as a "second electrode 17b") among the plurality of second electrodes 17 with a second capacitor 20 provided in the interlayer insulating film 16 therebetween. Like the second electrode 17a, the second electrode 17b is connected to the first electrode 7a connected to the wiring of the fourth wiring layer 5d or the first electrode 7b connected to the wiring of the fourth wiring layer 5*d* with the first capacitor 10 therebetween. As shown in FIG. 8, at a connection part between the second electrode 17*b* and the first electrode 7*a*, the wiring of the fourth wiring layer 5*d* of the first substrate 2 and the wiring of the sixth wiring layer 15*f* of the second substrate 3 are electrically connected with the first electrode 7*a*, the second electrode 17*b* and the second capacitor 20 therebetween. Therefore, the charge of these wirings can be accumulated in the second capacitor 20.

Figure 9:
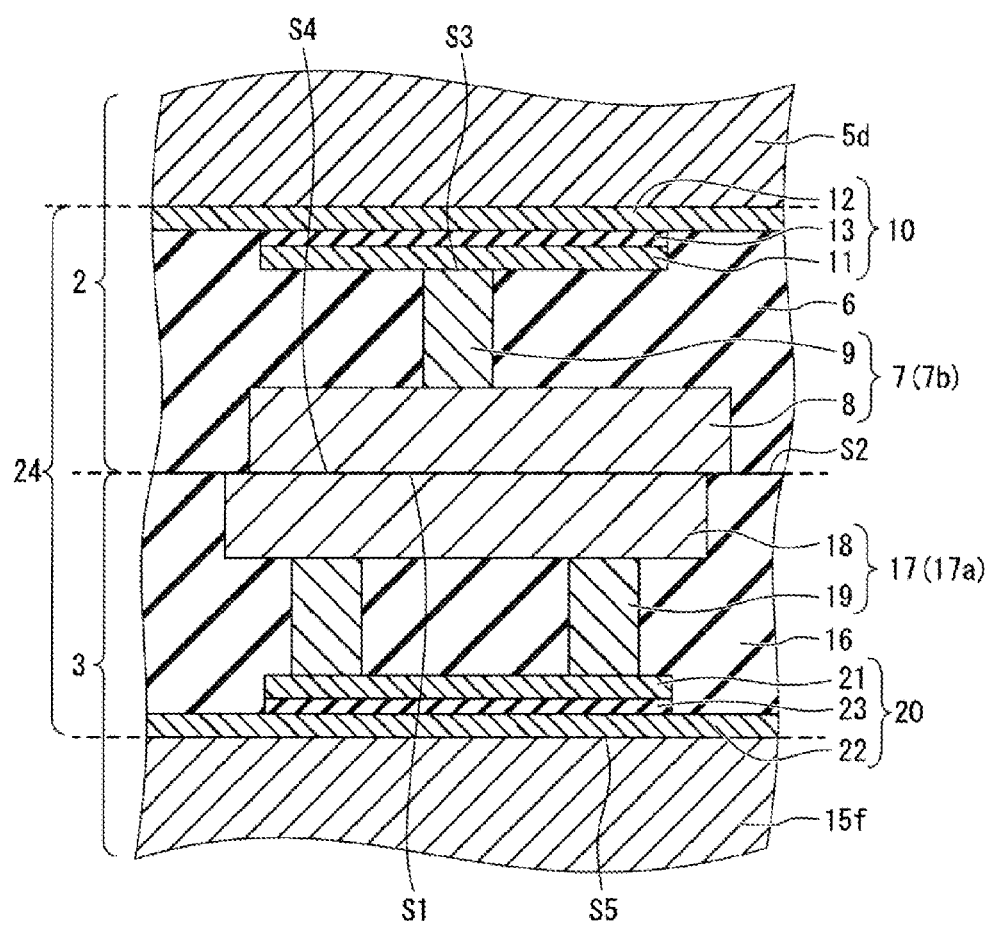
FIG. 9 is a cross-sectional view showing a first electrode and a second electrode bonded to each other.

On the other hand, as shown in FIG. 9, at a connection part between the second electrode 17*b* and the first electrode 7*b*, the wiring of the fourth wiring layer 5*d* of the first substrate 2 and the wiring of the sixth wiring layer 15*f* of the second substrate 3 are electrically connected with the first capacitor 10 therebetween in addition to the first electrode 7*b*, the second electrode 17*b* and the second capacitor 20. Therefore, the charge of these wirings can be accumulated in the first capacitor 10 and the second capacitor 20. Here, when the configuration of the connection part shown in FIG. 8 and FIG. 9 is realized, for example, either the wiring of the fourth wiring layer 5*d* or the wiring of the sixth wiring layer 15*f* electrically connected to the first capacitor 10 or the second capacitor 20 may be used as a ground wiring.

The second capacitor 20 includes two flat electrodes 21 and 22 that face each other and an insulating film 23 arranged between the two electrodes 21 and 22. The electrode 21 is arranged on the side of the first substrate 2 (in FIG. 5, the upper side), and the second electrode 17*b* is electrically connected thereto. In addition, the electrode 22 is arranged on the side opposite to the first substrate 2 side (in FIG. 5, the lower side), and the wiring of the sixth wiring layer 15*f* is electrically connected thereto. In addition, as the material of the electrodes 21 and 22 and the insulating film 23, for example, the same materials as those of the electrodes 11 and 12 and the insulating film 13 of the first substrate 2 can be used.

Here, the region between the fourth wiring layer 5*d* of the first substrate 2 and the sixth wiring layer 15*f* of the second substrate 3 is defined as a region for substrate connection 24. That is, the region for substrate connection 24 is a region in which the interlayer insulating film 6 of the first substrate 2 and the interlayer insulating film 16 of the second substrate 3 are provided. Each of the first capacitor 10 and the second capacitor 20 is arranged on the outmost layer of the region for substrate connection 24.

With such a configuration, as shown in FIG. 6, in the region for substrate connection 24, the wiring of the fourth wiring layer 5*d* and the wiring of the sixth wiring layer 15*f* are electrically connected with the first electrode 7*a* and the second electrode 17*a* therebetween, and thus a signal is transmitted and power is supplied between the first substrate 2 and the second substrate 3. In addition, as shown in FIG. 7, FIG. 8 and FIG. 9, when the wiring of the fourth wiring layer 5*d* and the wiring of the sixth wiring layer 15*f* are electrically connected with the first capacitor 10 and the second capacitor 20 therebetween in addition to the first electrode 7*b* and the second electrode 17*a*, a capacitor function of accumulating the charge of the wiring of the fourth wiring layer 5*d* and the charge of the wiring of the sixth wiring layer 15*f* is realized.

1-2 Method of Producing Semiconductor Device

Next, a method of producing the semiconductor device 1 of the first embodiment will be described. FIGS. 10A, 10B, 11A, 11B, 12, and 13 show diagrams illustrating a process of producing the semiconductor device 1 of the first embodiment.

Figure 10A:
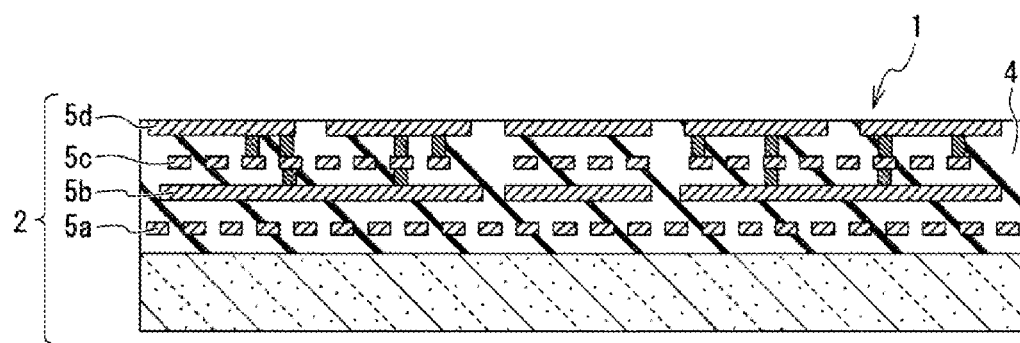
FIG. 10A is a cross-sectional view showing a first substrate before a region for substrate connection is formed.
Figure 10B:
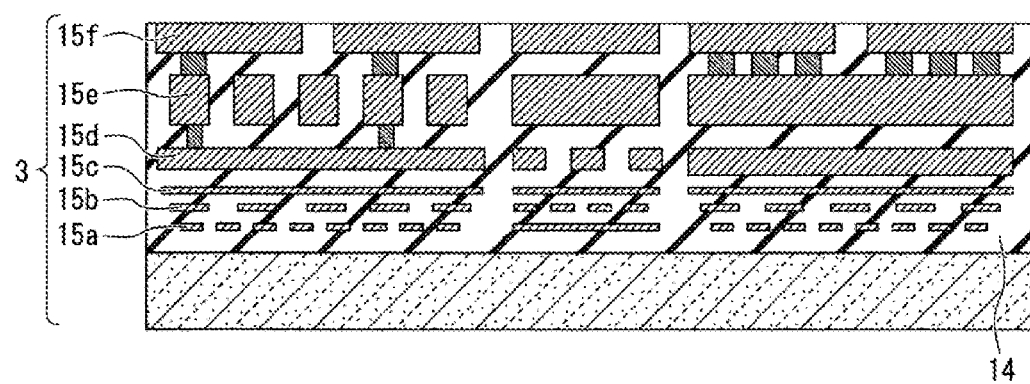
FIG. 10B is a cross-sectional view showing a second substrate before a region for substrate connection is formed.

First, as shown in FIGS. 10A and 10B, the first substrate 2 (for example, a sensor substrate) is prepared before the region for substrate connection 24, a color filter 36, and a micro lens 37 are formed and the second substrate 3 (for example, a logic substrate) is prepared before the region for substrate connection 24 is formed.

Figure 11A:
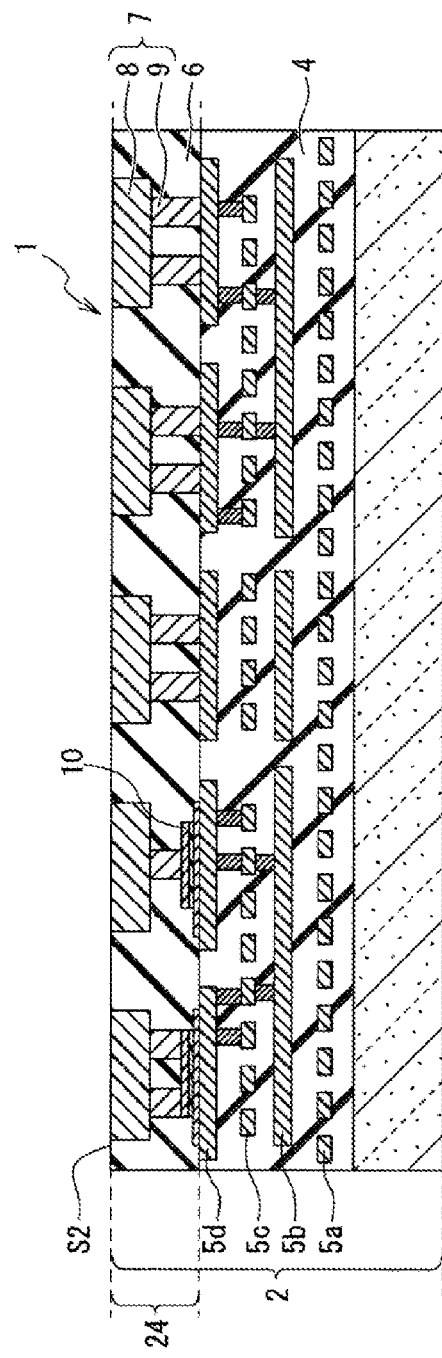
FIG. 11A is a cross-sectional view showing a first substrate after a region for substrate connection is formed.
Figure 11B:
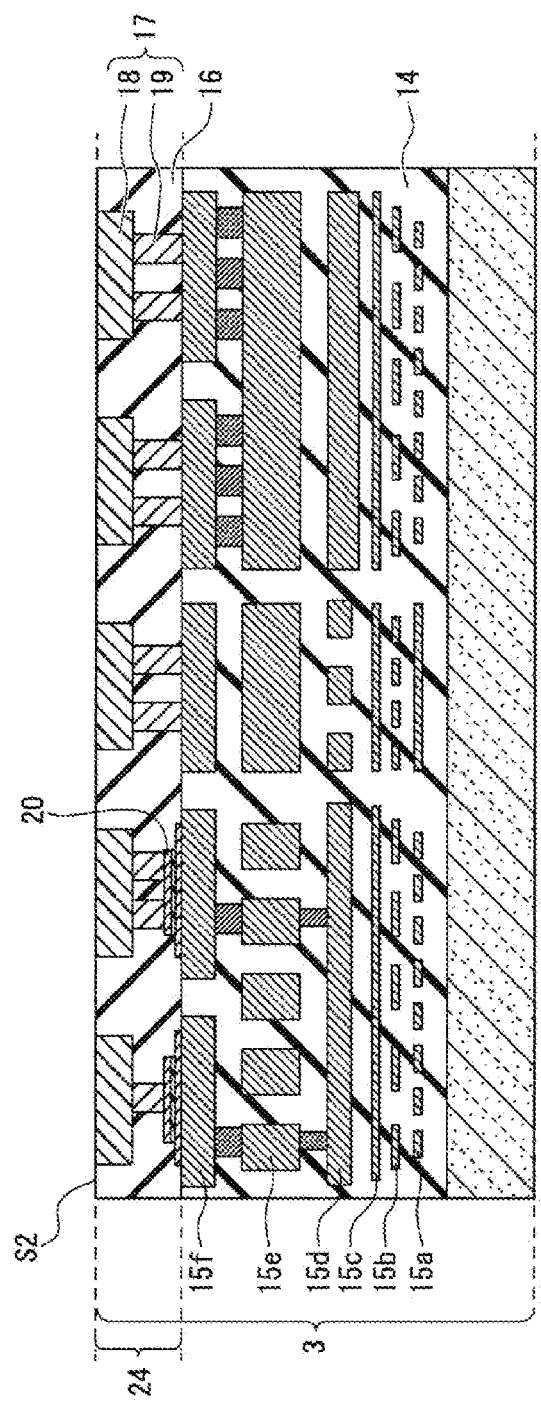
FIG. 11B is a cross-sectional view showing a second substrate after a region for substrate connection is formed.

Subsequently, as shown in FIG. 11A, the first capacitor 10, the interlayer insulating film 6, the first via 9 and the first electrode pad 8 are formed on the prepared first substrate 2 in that order. Thereby, the region for substrate connection 24 is formed on the first substrate 2. Similarly, as shown in FIG. 11B, the second capacitor 20, the interlayer insulating film 16, the second via 19 and the second electrode pad 18 are formed on the prepared second substrate 3 in that order. Thereby, the region for substrate connection 24 is formed on the second substrate 3.

Figure 12:
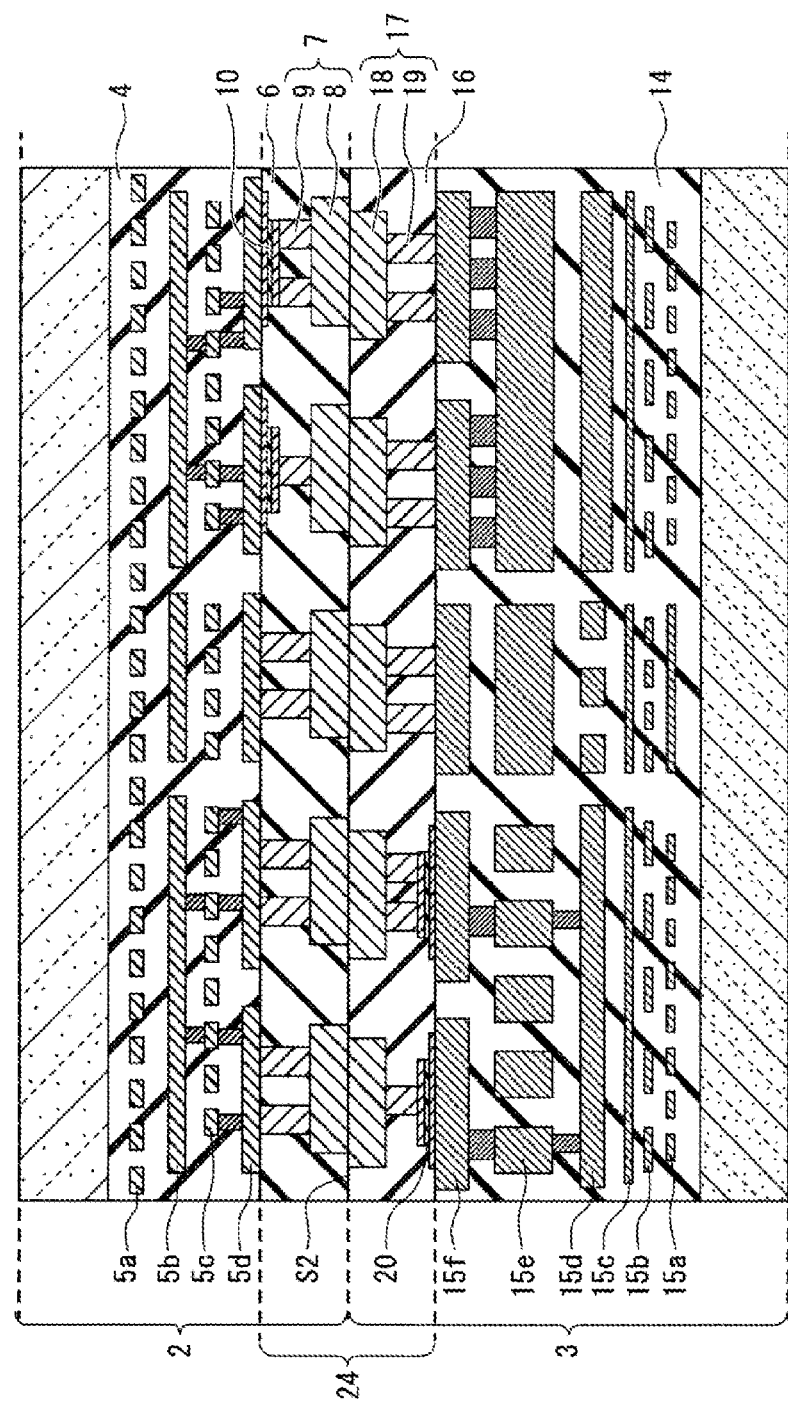
FIG. 12 is a cross-sectional view showing a first substrate and a second substrate after bonding.

Subsequently, as shown in FIG. 12, the first substrate 2 and the second substrate 3 are bonded so that the region for substrate connection 24 of the first substrate 2 and the region for substrate connection 24 of the second substrate 3 overlap each other. As a method of bonding the first substrate 2 to the second substrate 3, for example, plasma bonding can be used.

Figure 13:
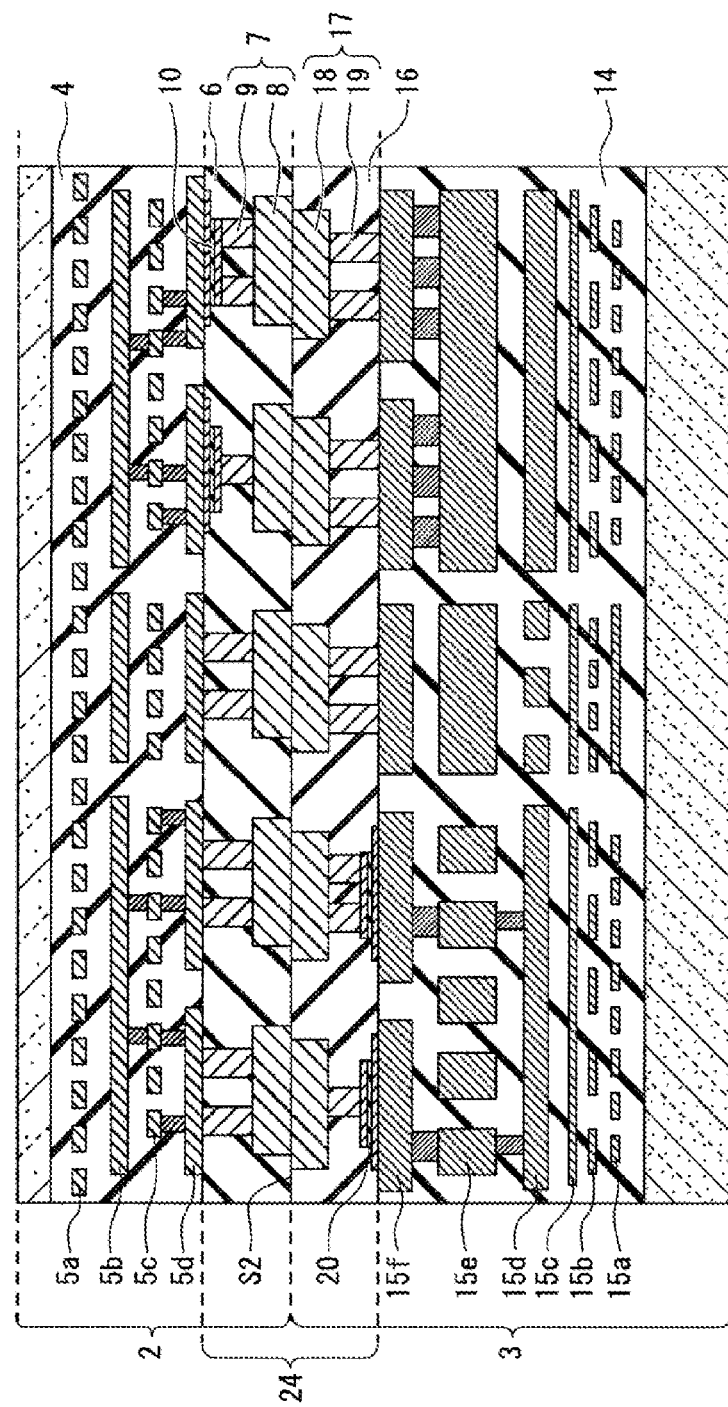
FIG. 13 is a cross-sectional view showing a first substrate and a second substrate after thinning.

Subsequently, as shown in FIG. 13, the first substrate 2 is thinned.

Subsequently, as shown in FIG. 1, the color filter 36, the micro lens 37 and the like are formed on the light incident side of the first substrate 2. Thereby, the semiconductor device 1 of the first embodiment is formed.

As described above, as shown in FIG. 1 to FIG. 5, the semiconductor device 1 of the first embodiment includes at least one of the first capacitor 10 which is provided in the first substrate 2 and of which one electrode 11 is electrically connected to the non-exposed surface S3 of the first electrode 7(7*b*) and the second capacitor 20 which is provided in the second substrate 3 and of which one electrode 21 is electrically connected to the non-exposed surface S5 of the second electrode 17(17*b*). Therefore, for example, compared with the method in which the first electrode 7(7*b*) is used as the electrode 11 of the first capacitor 10, and the second electrode 17(17*b*) is used as the electrode 21 of the second capacitor 20, since the positions of the first capacitor 10 and the second capacitor 20 are far from the bonding surface S2, the stress due to the bonding process is not directly applied to the first capacitor 10 and the second capacitor 20. Therefore, it is possible to provide the semiconductor device 1 that can minimize deterioration of performance of the first capacitor 10 and the second capacitor 20 (capacitor) due to the bonding process.

In addition, since the first electrode 7(7*b*) and the second electrode 17(17*b*) do not come into contact with the insulating film 13 of the first capacitor 10 and the insulating film 23 of the second capacitor 20, for example, even if the first electrode 7(7*b*) and the second electrode 17(17*b*) are a copper electrode made of pure copper or a copper alloy, it is possible to prevent copper contained in the first electrode 7(7*b*) and the second electrode 17(17*b*) from diffusing into the insulating films 13 and 23. In addition, for example, compared with the method in which the first electrode 7 and the second electrode 17 are used as the electrodes 11 and 21 of the first capacitor 10 and the second capacitor 20, it is possible to increase the degree of freedom for the material of the electrodes 11 and 21 and improve characteristics of the first capacitor 10 and the second capacitor 20.

In addition, for example, unlike the method in which the first capacitor 10 and the second capacitor 20 are provided on the fourth wiring layer 5*d* of the first substrate 2 and the sixth wiring layer 15*f* of the second substrate 3, it is possible to prevent the first capacitor 10 from using the region in the fourth wiring layer 5*d* and the second capacitor 20 from using the region in the sixth wiring layer 15*f*, it is possible to minimize an increase in the size of the fourth wiring layer 5*d* and the sixth wiring layer 15*f*, and it is possible to minimize an increase in the size of the semiconductor device 1. In addition, it is possible to prevent the wiring density of the fourth wiring layer 5*d* and the sixth wiring layer 15*f* from increasing and improve the yield.

That is, in the semiconductor device 1 of the first embodiment, the fact that the region for substrate connection 24 between the first substrate 2 and the second substrate 3 is not a region in which the metal densities are closest as in the first wiring layer 5*a* to the fourth wiring layer 5*d* of the first substrate 2 and the first wiring layer 15*a* to the sixth wiring layer 15*f* of the second substrate 3 is focused on. According to the semiconductor device 1 of the first embodiment, when the first capacitor 10 and the second capacitor 20 are provided in the region for substrate connection 24, the region for substrate connection 24 can be effectively utilized.

In addition, in the semiconductor device 1 of the first embodiment, when the first capacitor 10 and the second capacitor 20 are used, it is possible to realize a function of cutting off noise generated in a power supply or an analog circuit and a storage function for storing charge temporarily. For example, when noise is contained in the supply of power, since the semiconductor device 1 operates with the supply of power containing noise, the semiconductor device 1 may not operate appropriately. On the other hand, when a noise cut-off function is realized, since the power from which noise has been removed is supplied to the semiconductor device 1, the semiconductor device 1 can be operated appropriately. In particular, when capacitors (the first capacitor 10 and the second capacitor 20) are mounted on the first substrate 2 and the second substrate 3, the noise removal performance can be doubled or better.

Figure 14:
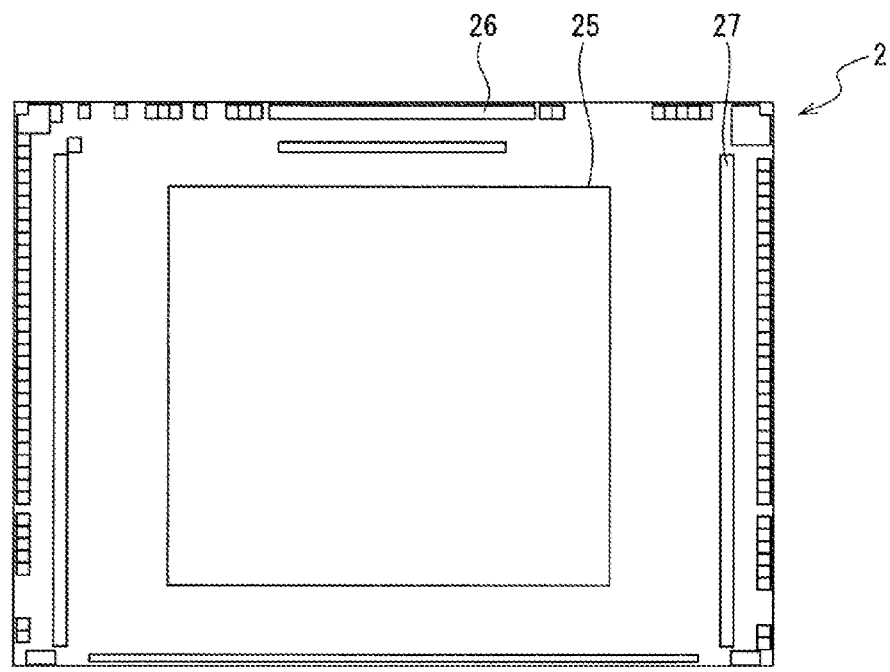
FIG. 14 is a plan view showing an overall structure of a sensor substrate.

Here, a case in which a sensor substrate is used as the first substrate 2, a logic substrate is used as the second substrate 3, and a solid-state imaging device is configured as the semiconductor device 1 is conceivable. In such a solid-state imaging device (the semiconductor device 1), as shown in FIG. 14, a pixel region 25 in which a photoelectric conversion unit and the like are provided is arranged in the center of the chip of the sensor substrate (the first substrate 2), an I/O unit 26 in which an I/O pad and the like are provided is arranged on the outer peripheral part of the chip, and a driver 27, which is a transmission path for photoelectrically converted signals, is arranged between the pixel region 25 and the I/O unit 26. The driver 27 is formed by arranging the first electrode 7*a* (refer to FIG. 2) bonded to the second electrode 17*a* (refer to FIG. 4) in an array form. Therefore, the solid-state imaging device (the semiconductor device 1) transmits the signal photoelectrically converted in the pixel region 25 of the image sensor (the first substrate 2) to the logic substrate (the second substrate 3) through the driver 27, performs calculation in the logic substrate (the second substrate 3) based on the transmitted signal, and outputs the calculation result to an external display or the like through the I/O unit 26.

In the solid-state imaging device (the semiconductor device 1) shown in FIG. 14, generally, in a region other than the region occupied by the driver 27, that is, most of the region of the sensor substrate (the first substrate 2), a dummy electrode for robustly bonding the first substrate 2 and the second substrate 3 is laid out. The dummy electrode is an electrode which includes an electrode pad, a via and the like as in the first electrode 7 and the second electrode 17, but is not electrically connected to either the first substrate 2 or the second substrate 3. Therefore, since the region in which the dummy electrode is laid out does not have a function for electrically connecting the first substrate 2 and the second substrate 3, it can be used for the layout of the first electrode 7*a* and the second electrode 17*a* of the first embodiment, that is, electrodes electrically connected to the first capacitor 10 and the second capacitor 20. Therefore, when the solid-state imaging device (the semiconductor device 1) shown in FIG. 14 is formed, a wide region can be prepared as a region in which the first capacitor 10 and the second capacitor 20 can be laid out, the degree of freedom for the layout of the first capacitor 10 and the second capacitor 20 can increase, and the difficulty in designing the solid-state imaging device (the semiconductor device 1) can be reduced.

In addition, in the solid-state imaging device (the semiconductor device 1) shown in FIG. 14, when noise is contained in the supply of power, since the solid-state imaging device (the semiconductor device 1) operates with the supply of power containing noise, the image produced by the solid-state imaging device (the semiconductor device 1) reacts sensitively to noise, and in a severe case, the image may be streaked. Here, the power supply is generated by an AC-DC conversion unit inside the system such as a smartphone, a camera, and a monitoring device in which the solid-state imaging device (the semiconductor device 1) is mounted, and supplied from a plurality of terminals provided in the I/O unit 26. On the other hand, when the solid-state imaging device (the semiconductor device 1) shown in FIG. 14 is formed, there is a wide region around the I/O unit 26 as a region in which the first capacitor 10 and the second capacitor 20 can be laid out. Therefore, a noise cut-off function can be realized by laying out the first capacitor 10 and the second capacitor 20 in the vicinity of the I/O unit 26, the power from which noise has been removed can be supplied to the solid-state imaging device (the semiconductor device 1), and a clearer image can be created by the solid-state imaging device (the semiconductor device 1).

In addition, when the first capacitor 10 and the second capacitor 20 are laid out in the vicinity of the I/O unit 26 and a noise cut-off function is realized, for example, noise can be removed from the signal output to the display via the I/O unit 26, an electrical load on the display can be reduced, and an image with little noise can be projected on the display.

Here, a case in which a function of cutting off noise at a macro level is realized has been described so far, but the same effect can be obtained for a case in which a function of cutting off noise at a micro level is realized. For example, in the solid-state imaging device (the semiconductor device 1) shown in FIG. 14, when the signal from the photoelectric conversion unit in an analog circuit such as a pixel transistor is superimposed with noise, even if it is digitized by an AD converter of pixel units or area units, it is difficult to prevent the signal quality from deteriorating. On the other hand, if a noise cut function can be realized in pixel units or area units using the first capacitor 10 and the second capacitor 20, it is possible to prevent the signal quality from deteriorating, and a clearer image can be created by the solid-state imaging device (the semiconductor device 1).

In addition, when a storage function is realized by laying out the first capacitor 10 and the second capacitor 20, it can also be used for accumulating charges of the global shutter. By using it for charge accumulation, a fast-moving subject can be imaged with a distortion-free image.

In addition, in the semiconductor device 1 of the first embodiment, the first electrode 7 includes the first electrode pad 8 of which one surface is positioned on the same surface as the bonding surface S2 and the first via 9 extending from the other surface of the first electrode pad 8. In addition, the second electrode 17 includes the second electrode pad 18 of which one surface is positioned on the same surface as the bonding surface S2 and the second via 19 extending from the other surface of the second electrode pad 18. Therefore, the amount of copper used in the first electrode 7 and the second electrode 17 can be reduced, the production cost can be reduced, and the size of the bonding surface S2 between the first electrode 7 and the second electrode 17 can be increased.

In addition, in the semiconductor device 1 of the first embodiment, at least one of the first capacitor 10 and the second capacitor 20 includes two electrodes 11 and 12 that face each other and the insulating film 13 arranged between the two electrodes 11 and 12. Therefore, the first capacitor 10 and the second capacitor 20 can have a metal-insulator-metal (MIM) structure, and the first capacitor 10 and the second capacitor 20 can have a high capacitance density.

Figure 15:
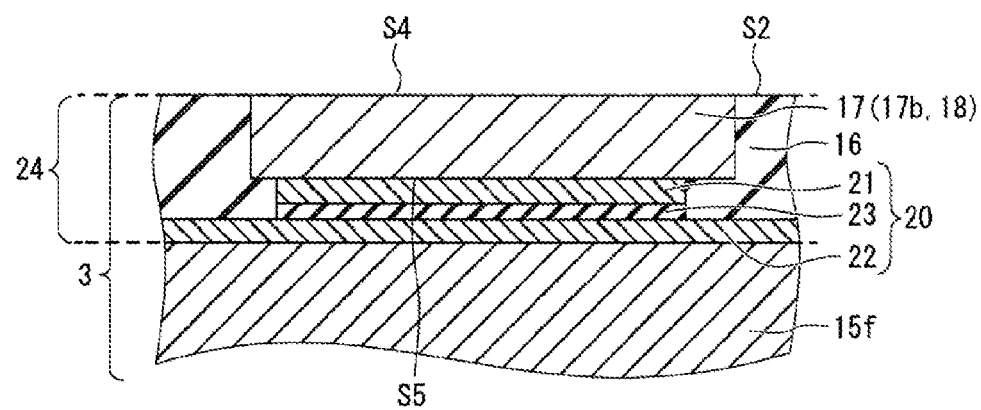
FIG. 15 is a cross-sectional view showing a second electrode according to a modification example.

1-3 Modification Example (1) Here, in the first embodiment, an example in which the second electrode 17 is composed of the second electrode pad 18 and the second via 19 is shown, but other configurations can be used. For example, as shown in FIG. 15, the second via 19 may be omitted, and the second electrode 17 may be composed of only the second electrode pad 18. Similarly, the first electrode 7 may be composed of only the first electrode pad 8.

Figure 16:
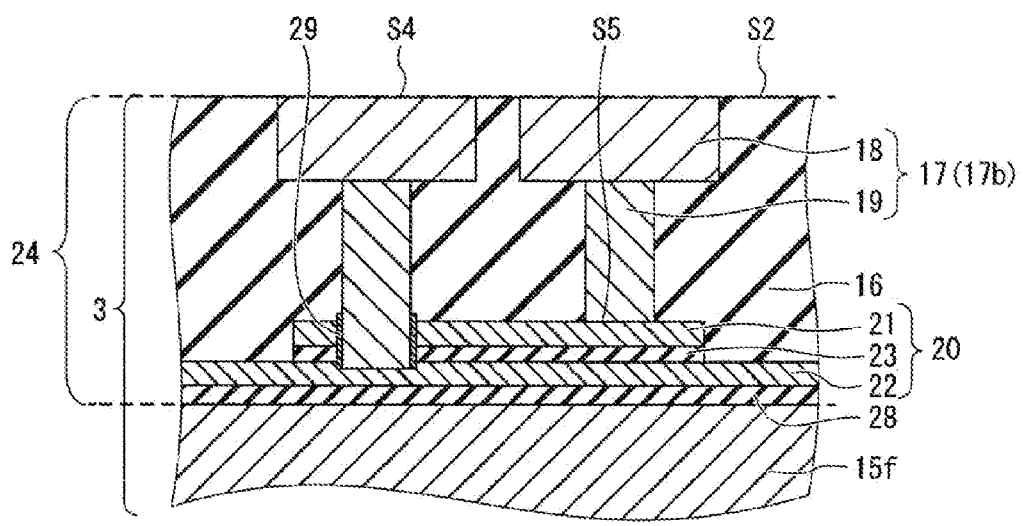
FIG. 16 is a cross-sectional view showing a second capacitor according to a modification example.

(2) In addition, in the first embodiment, an example in which the electrode 22 of the second capacitor 20 is connected to the wiring of the sixth wiring layer 15$f$ is shown, but other configurations can be used. For example, as shown in FIG. 16, electrical connection to a second electrode 17 different from the second electrode 17 connected to the electrode 21 may be formed. In FIG. 16, in order to prevent the electrode 22 and the wiring of the sixth wiring layer 15$f$ from being electrically connected, an insulating film 28 is arranged therebetween. In addition, the periphery of the second via 19 of the second electrode 17 connected to the electrode 22 is covered with an insulating film 29 so that it is not electrically connected to the electrode 21. Similarly, the electrode 12 of the first capacitor 10 may be electrically connected to a first electrode 7 different from the first electrode 7 connected to the electrode 11.

(3) Here, generally, the capacitance C of the capacitor is defined by the following Formula (1) using a relative dielectric constant $\varepsilon_r$, a vacuum dielectric constant $\varepsilon_0$, an electrode area S, and a distance d between electrodes.

$$C=\varepsilon_r \cdot \varepsilon_0 \cdot S/d \tag{1}$$

According to Formula (1), the capacitance C of the capacitor can be increased by any of reducing the distance d between electrodes, enlarging the electrode area S, and increasing the relative dielectric constant $\varepsilon_r$. However, in order to reduce the distance d between electrodes, the insulating film arranged between electrodes should be thinned, and there is a high possibility of short-circuiting between the electrodes. In particular, when capacitors are formed by stacking using a planar technology, in consideration of flattening, a thin film of a material having a large relative dielectric constant $\varepsilon_r$ is generally used as an insulating film so that a region in which the capacitors are formed is not higher than the other regions. Therefore, there is a higher possibility of short-circuiting between the electrodes. In addition, the probability of short-circuiting occurring between electrodes is largely influenced by defects of the insulating film caused by dust or the like, and is defined by the defect density of the insulating film. The defect density of the insulating film can be reduced to some extent by devising devices, processes and the like used for production of the semiconductor device 1, but cannot be reduced to zero.

Figure 17:
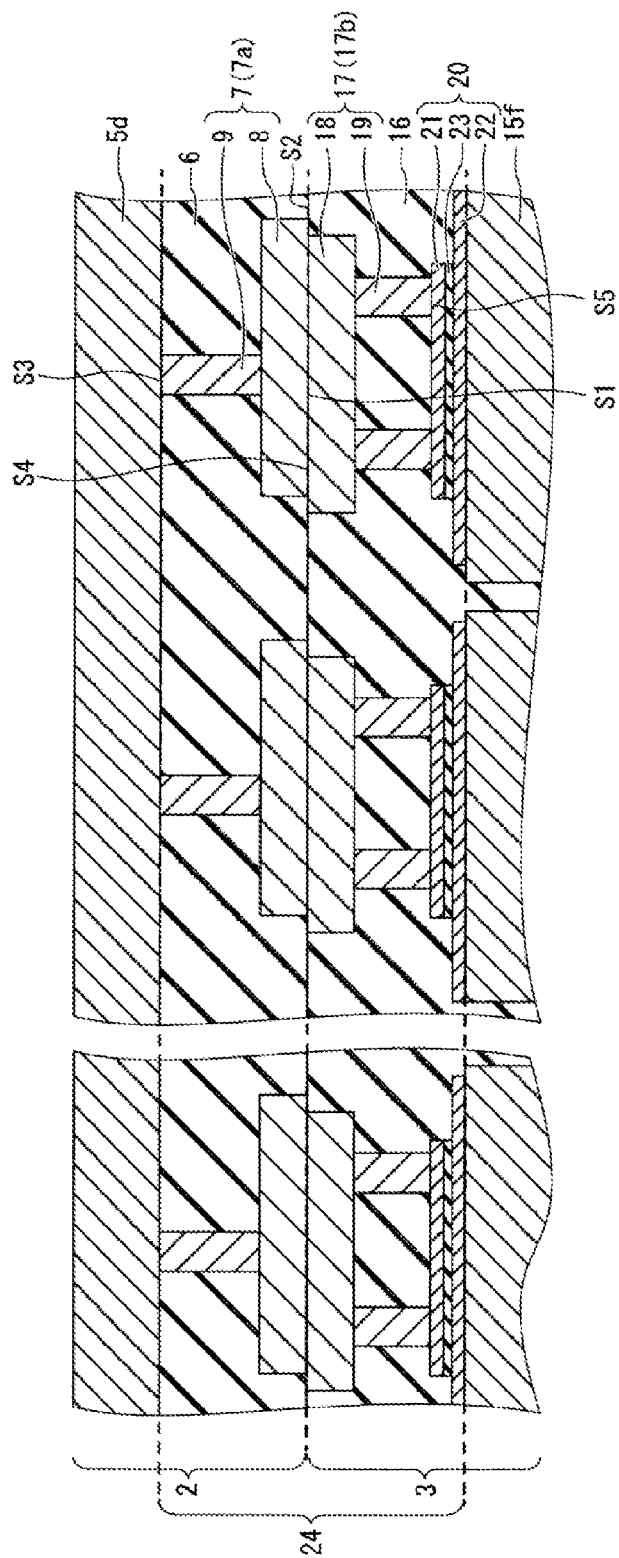
FIG. 17 is a cross-sectional view showing a region for substrate connection according to a modification example.

On the other hand, a configuration in which at least one of the first capacitor 10 and the second capacitor 20 is divided and laid out using the high degree of freedom for the layout of the first capacitor 10 and the second capacitor 20 may be used. In this case, as shown in FIG. 17, a configuration in which two or more of the plurality of first capacitors 10 or two or more of the plurality of second capacitors 20 are connected to the same wiring is used. FIG. 17 illustrates a configuration in which two or more second capacitors 20 are connected to the same wiring (wiring of the fourth wiring layer 5$d$) in the first substrate 2. With the configuration shown in FIG. 17, two or more second capacitors 20 can be connected in parallel, and the same capacitance as a large capacitor having the same area as the total area of the second capacitors 20 connected in parallel can be realized. That is, since a large capacitance can be realized with a small capacitor (the second capacitor 20), it is possible to improve the yield of the semiconductor device 1. In addition, when the divided capacitor (the second capacitor 20) is redundantly laid out, it is possible to further improve the yield of the semiconductor device 1. Here, an example in which two or more of the plurality of second capacitors 20 are connected to the same wiring has been described, but the same effect can be obtained when two or more of the plurality of first capacitors 10 are connected to the same wiring.

(4) In addition, in the first embodiment, an example in which the first capacitor 10 has a configuration in which the insulating film 13 is arranged between the two electrodes 11 and 12 and the second capacitor 20 has a configuration in which the insulating film 23 is arranged between the two electrodes 21 and 22 is shown, but other configurations can be used. For example, as shown in FIGS. 18A and 18B, at least one of the first capacitor 10 and the second capacitor 20 may have a multilayer structure in which an electrode 30 and an insulating film 31 are alternately and repeatedly arranged.

Figure 18A:
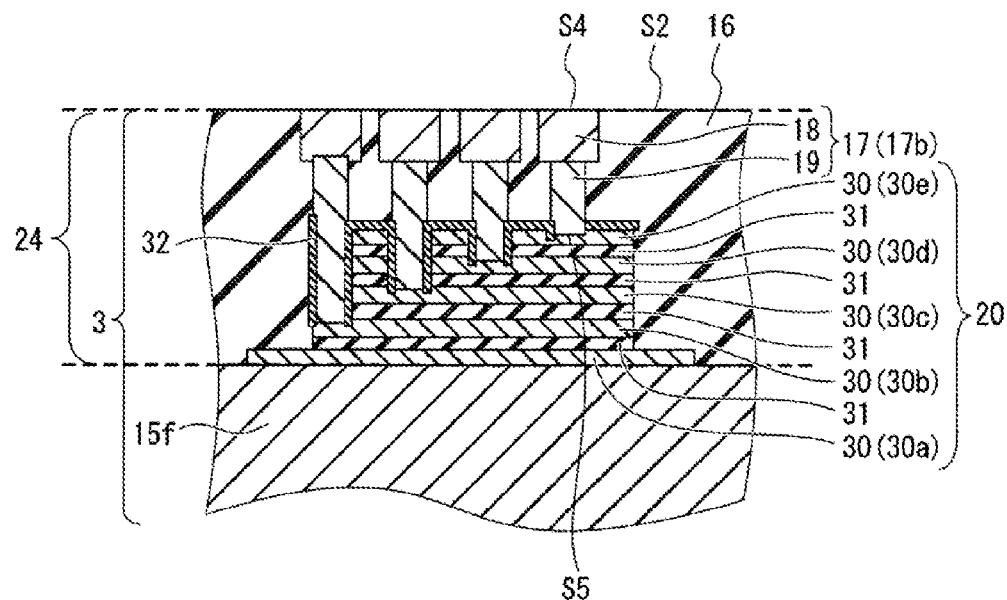
FIG. 18A is a cross-sectional view showing a second capacitor according to a modification example.
Figure 18B:
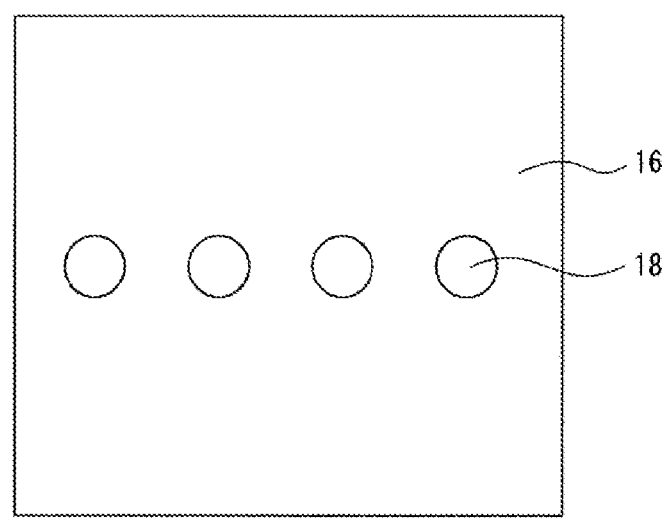
FIG. 18B is a plan view showing the second substrate in FIG. 18A when viewed from the bonding surface side.

FIGS. 18A and 18B illustrate a configuration in which the second capacitor 20 has a multilayer structure. In FIGS. 18A and 18B, the electrode 30 (hereinafter referred to as an "electrode 30$a$") closest to the side of the sixth wiring layer 15$f$ among the electrodes 30 forming the multilayer structure is electrically connected to the sixth wiring layer 15$f$, and the other electrodes 30 (hereinafter referred to as an "electrode 30$b$," "electrode 30$c$," "electrode 30$d$," or "electrode 30$e$") electrically connected to the second electrodes 17 are different from each other. That is, each of the electrodes 30$b$ to 30$e$ corresponds to "one electrode 21" of the first embodiment The periphery of the second via 19 of the second electrode 17 is covered with an insulating film 32 in order to prevent electrical connection to the electrode 30, which is not a connection target. In the second capacitor 20 shown in FIGS. 18A and 18B, a capacitor is formed by the electrodes 30$a$ and 30$b$ and the insulating film 31, a capacitor is formed by the electrodes 30$b$ and 30$c$ and the insulating film 31, a capacitor is formed by the electrodes 30c and 30d and the insulating film 31, a capacitor is formed by the electrodes 30d and 30e and the insulating film 31, and a total of four capacitors are formed.

With the configuration shown in FIGS. 18A and 18B, for example, the capacitor can be appropriately laid out even when there is a limitation on the region in which the capacitor can be laid out, for example, when a capacitor (the second capacitor 20) is provided for each pixel. Here, an example in which the second capacitor 20 has a multilayer structure has been described, but the same effect can also be obtained when the first capacitor 10 has a multilayer structure.

(5) In addition, in the first embodiment, an example in which the first capacitor 10 and the second capacitor 20 have a flat shape is shown, but other configurations can be used. For example, as shown in FIG. 19, the first capacitor 10 and the second capacitor 20 may have a 3D shape so that the areas of the electrodes 11 and 12, 21, 22 of the first capacitor 10 and the second capacitor 20 become large.

Figure 19:
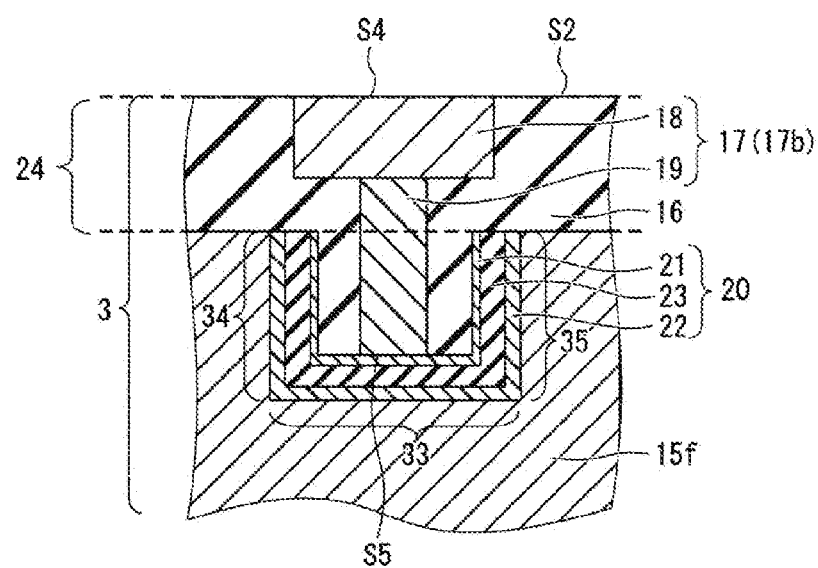
FIG. 19 is a cross-sectional view showing a second capacitor according to a modification example.

FIG. 19 illustrates a configuration in which the second capacitor 20 has a 3D shape. In FIG. 19, the second capacitor 20 includes a bottom part 33 and side wall parts 34 and 35 extending from the edge part of the bottom part 33 in a direction intersecting the bottom part 33. In addition, the second capacitor 20 is provided in the sixth wiring layer 15f, and end surfaces of the side wall parts 34 and 35 on the side of the first substrate 2 are positioned on the same surface as the bonding surface S2. With the configuration shown in FIG. 19, the area of the electrodes 21 and 22 of the second capacitor 20 can be increased, and the capacitance of the second capacitor 20 can be increased. In addition, when the second capacitors 20 having a large capacitance are connected in parallel, it is possible to realize the same capacitance as a capacitor having an area equal to the total area of the second capacitors 20 connected in parallel. In this case, when aluminum (Al) is used for the wiring of the sixth wiring layer 15f in which the second capacitor 20 is provided, processing can be easily performed and the process cost can be reduced. Here, an example in which the second capacitor 20 is composed of the bottom part 33 and the side wall parts 34 and 35 has been described, but the same effect can also be obtained when the first capacitor 10 is composed of a bottom part and a side wall part.

2. Example of Application to Solid-State Imaging Device 2-1 Configuration of Solid-State Imaging Device The technology according to the present disclosure (the present technology) can be applied to various products. For example, the technology according to the present disclosure may be applied to the solid-state imaging device.

Figure 20:
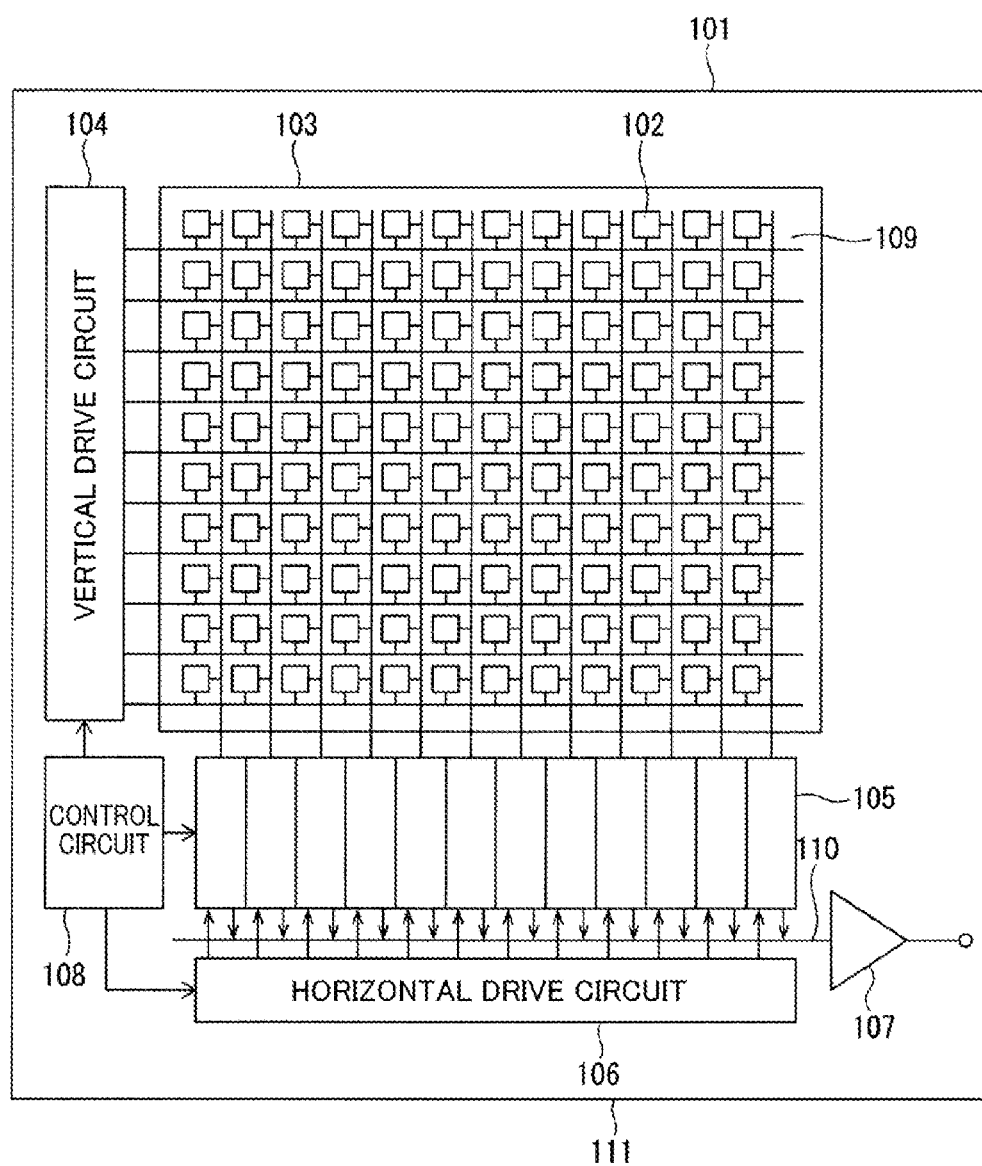
FIG. 20 is a block diagram showing an example of a schematic configuration of a solid-state imaging device.

FIG. 20 is a diagram showing an example of a schematic configuration of the solid-state imaging device to which the technology according to the present disclosure (the present technology) can be applied.

As shown in FIG. 20, a solid-state imaging device 101 has a configuration including a pixel unit 103 composed of a plurality of pixels 102 arranged on a substrate 111 made of silicon, a vertical drive circuit 104, a column signal processing circuit 105, a horizontal drive circuit 106, an output circuit 107, a control circuit 108, and the like.

A plurality of pixels 102 including a photoelectric conversion unit composed of a photodiode, a charge accumulated capacitance part, and a plurality of MOS transistors are regularly arranged on the substrate 111 in a 2D array form. The MOS transistors constituting the pixel 102 may be four MOS transistors composed of a transfer transistor, a reset transistor, a select transistor, and an amplifier transistor, or may be three MOS transistors excluding the select transistor.

The pixel unit 103 is composed of a plurality of pixels 102 that are regularly arranged in a 2D array form. The pixel unit 103 is composed of an effective pixel region in which light is actually received, and a signal charge generated by photoelectric conversion is amplified, and read in the column signal processing circuit 105, and a black reference pixel region (not shown) for outputting optical black that serves as a reference for the black level. The black reference pixel region is generally formed on the outer peripheral part of the effective pixel region.

The control circuit 108 generates a clock signal, a control signal, or the like that serves as a reference for the operation of the vertical drive circuit 104, the column signal processing circuit 105, the horizontal drive circuit 106 and the like based on a vertical synchronization signal, a horizontal synchronization signal and a master clock. Therefore, the clock signal, the control signal and the like generated by the control circuit 108 are input to the vertical drive circuit 104, the column signal processing circuit 105, the horizontal drive circuit 106, and the like.

The vertical drive circuit 104 is composed of, for example, shift registers, and sequentially selects and scans each pixel 102 of the pixel unit 103 in row units in the vertical direction. Therefore, the pixel signal based on the signal charge generated in the photodiode of each pixel 102 according to the intensity of the light received is supplied to the column signal processing circuit 105 through a vertical signal line 109.

The column signal processing circuit 105 is arranged, for example, for each column of the pixel 102, and the signal output from the pixel 102 for one row is subjected to signal processing such as noise removal and signal amplification using the signal from the black reference pixel region (not shown, but formed around the effective pixel region) for each pixel column. A horizontal selection switch (not shown) is provided between the output end of the column signal processing circuit 105 and a horizontal signal line 110.

The horizontal drive circuit 106 is composed of, for example, shift registers, and sequentially outputs a horizontal scanning pulse and thus selects each of the column signal processing circuits 105 in order, and outputs a pixel signal from each of the column signal processing circuits 105 to the horizontal signal line 110.

The output circuit 107 performs signal processing on the signal sequentially supplied from each of the column signal processing circuits 105 through the horizontal signal line 110 and outputs it.

2-2 Configuration of Sensor Substrate

Figure 21:
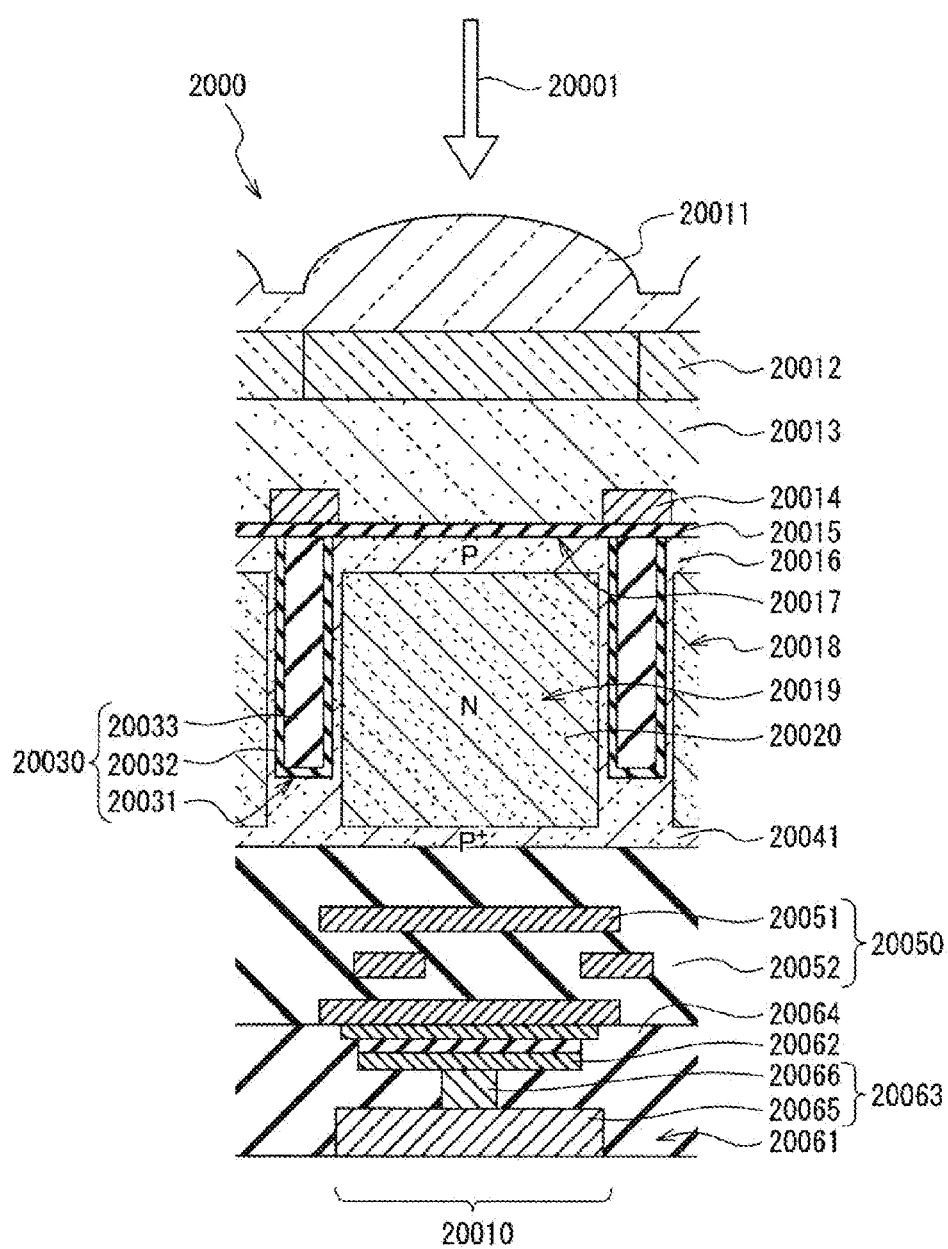
FIG. 21 is a cross-sectional view showing a cross section of a solid-state imaging device for one pixel.

Next, a schematic configuration of the sensor substrate constituting the solid-state imaging device 101 will be described. FIG. 21 is a cross-sectional view showing a cross section of a sensor substrate 20000 for one pixel.

As shown in FIG. 21, in the sensor substrate 20000, a photodiode (PD) 20019 receives incident light 20001 that enters from the back surface (the top surface in FIG. 21) of a semiconductor substrate 20018. A flattening film 20013, a color filter (CF) 20012, and a micro lens 20011 are provided above the PD 20019, and the incident light 20001 incident sequentially through respective units is received on a light receiving surface 20017 and subjected to photoelectric conversion.

For example, in the PD 20019, an n-type semiconductor region 20020 is formed as a charge accumulated region in which charges (electrons) are accumulated. In the PD 20019, the n-type semiconductor region 20020 is provided inside p-type semiconductor regions 20016 and 20041 of the semiconductor substrate 20018. The p-type semiconductor region 20041 having a higher impurity concentration than the back surface (top surface) side is provided on the front surface (bottom surface) side of the semiconductor substrate 20018 of the n-type semiconductor region 20020. That is, the PD 20019 has a hole-accumulation diode (HAD) structure, and the p-type semiconductor regions 20016 and 20041 are formed at each interface between the top surface side and the bottom surface side of the n-type semiconductor region 20020 so that generation of a dark current is restricted.

A pixel separation unit 20030 that electrically separates a plurality of pixels 20010 is provides inside the semiconductor substrate 20018, and the PD 20019 is provided in a region partitioned by the pixel separation unit 20030. In the drawing, when the solid-state imaging device is viewed from the top surface side, for example, the pixel separation unit 20030 is formed in a grid pattern between the plurality of pixels 20010, and the PD 20019 is formed in the region partitioned by the pixel separation unit 20030.

In each PD 20019, the anode is grounded, and in the solid-state imaging device, the signal charge (for example, electron) accumulated in the PD 20019 is read via a transfer Tr (MOS FET) (not shown) or the like, and output as an electrical signal to a vertical signal line (VSL) (not shown).

A wiring layer 20050 is provided on the front surface (bottom surface) of the semiconductor substrate 20018 on the side opposite to the back surface (top surface) in which respective units such as a light-blocking film 20014, the CF 20012, and the micro lens 20011 are provided.

The wiring layer 20050 includes a wiring 20051 and an insulation layer 20052, and is formed so that the wiring 20051 is electrically connected to each element in the insulation layer 20052. The wiring layer 20050 is a layer of so-called multilayer wiring, and is formed by alternately laminating the interlayer insulating film constituting the insulation layer 20052 and the wiring 20051 a plurality of times. Here, as the wiring 20051, the wiring to the Tr for reading the charge from the PD 20019 such as the transfer Tr and each wiring such as VSL are laminated with the insulation layer 20052 therebetween.

A region for substrate connection 20061 is provided on the surface of the wiring layer 20050 opposite to the side on which the PD 20019 is provided. The region for substrate connection 20061 includes a capacitor 20062, an electrode 20063, and an interlayer insulating film 20064, and in the interlayer insulating film 20064, one electrode of the capacitor 20062 is electrically connected to the wiring 20051 of the wiring layer 20050. In addition, the other electrode of the capacitor 20062 is electrically connected to the electrode 20063, and the electrode 20063 is exposed from the back surface (the bottom surface in the drawing) of the region for substrate connection 20061. FIG. 21 illustrates the electrode 20063 including a flat electrode pad 20065 positioned on the same surface as the back surface of the region for substrate connection 20061 and a columnar via 20066 extending from the back surface (the top surface in the drawing) of the electrode pad 20065 in the thickness direction (the upward direction in FIG. 21) of the sensor substrate 20000. The region for substrate connection 20061 is bonded to a region for substrate connection (notshown) of a logic substrate so that the electrode (not shown) of the logic chip and the electrode 20063 overlap each other.

The light-blocking film 20014 is provided on the side of the back surface (the top surface in the drawing) of the semiconductor substrate 20018.

The light-blocking film 20014 is configured to block some of the incident light 20001 that is directed toward the back surface of the semiconductor substrate 20018 from above the semiconductor substrate 20018.

The light-blocking film 20014 is provided above the pixel separation unit 20030 provided inside the semiconductor substrate 20018. Here, the light-blocking film 20014 is provided on the back surface (the top surface) of the semiconductor substrate 20018 so that it protrudes in a convex shape with an insulating film 20015 such as a silicon oxide film therebetween. On the other hand, above the PD 20019 provided inside the semiconductor substrate 20018, the light-blocking film 20014 is not provided and is open so that the incident light 20001 is incident on the PD 20019.

That is, in the drawing, when the solid-state imaging device is viewed from the top surface side, the planar shape of the light-blocking film 20014 is a grid pattern, and an opening through which the incident light 20001 passes to the light receiving surface 20017 is formed.

The light-blocking film 20014 is formed of a light-blocking material that blocks light. For example, the light-blocking film 20014 is formed by sequentially laminating a titanium (Ti) film and a tungsten (W) film. In addition to this, the light-blocking film 20014 can be formed by, for example, sequentially laminating a titanium nitride (TiN) film and a tungsten (W) film.

The light-blocking film 20014 is covered with the flattening film 20013. The flattening film 20013 is formed using an insulating material through which light passes.

The pixel separation unit 20030 includes a groove part 20031, a fixed charge film 20032, and an insulating film 20033.

The fixed charge film 20032 is formed on the side of the back surface (top surface) of the semiconductor substrate 20018 so that it covers the groove part 20031 that partitions between the plurality of pixels 20010.

Specifically, the fixed charge film 20032 is provided so that it covers the inner surface of the groove part 20031 formed on the side of the back surface (top surface) in the semiconductor substrate 20018 with a certain thickness. Therefore, the insulating film 20033 is provided (filled) to embed the inside of the groove part 20031 covered with the fixed charge film 20032.

Here, the fixed charge film 20032 is formed using a high dielectric material having a negative fixed charge so that a positive charge (hole) accumulated region is formed at the interface part with the semiconductor substrate 20018 and generation of a dark current is restricted. When the fixed charge film 20032 is formed so that it has a negative fixed charge, an electric field is applied to the interface with the semiconductor substrate 20018 according to the negative fixed charge, and a positive charge (hole) accumulated region is formed.

The fixed charge film 20032 can be formed as, for example, a hafnium oxide film ($HfO_2$ film). In addition, for example, the fixed charge film 20032 can be formed so that it contains at least one other oxide of hafnium, zirconium, aluminum, tantalum, titanium, magnesium, yttrium, and the lanthanoid elements.

An example of the solid-state imaging device to which the technology according to the present disclosure can be applied has been described above. The technology according to the present disclosure can be applied to the sensor substrate 20000 within the configuration described above. Specifically, the first capacitor 10 in FIG. 1 can be applied to the capacitor 20062 in FIG. 21, and the first electrode 7 in FIG. 1 can be applied to the electrode 20063 in FIG. 21. When the technology according to the present disclosure is applied to the sensor substrate 20000, since deterioration of the performance of the capacitor due to the bonding process can be minimized, a better captured image can be obtained.

2-3 Modification Example

Figure 22:
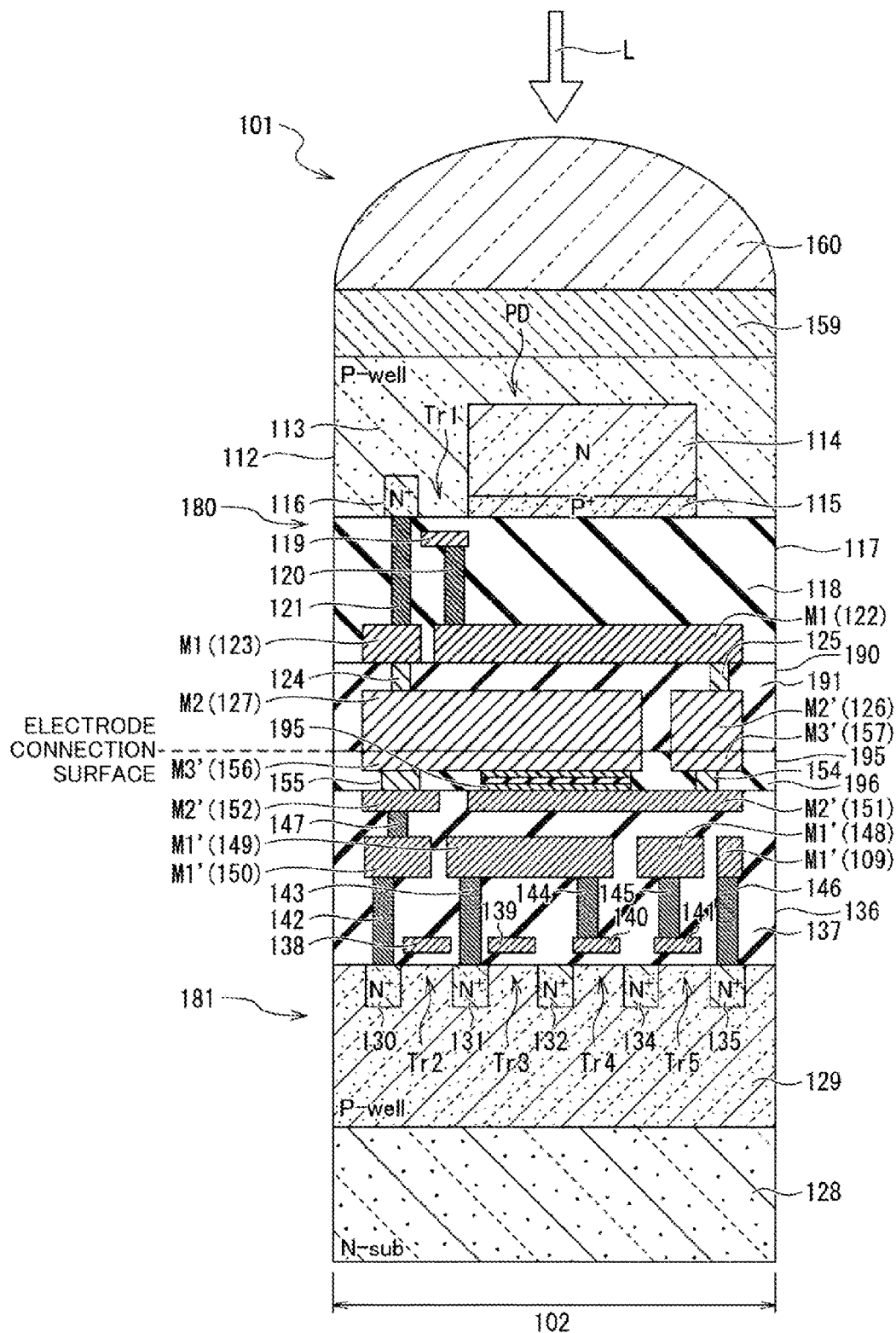
FIG. 22 is a block diagram showing an example of a schematic configuration of a solid-state imaging device.

In addition, the present technology may be applied to a solid-state imaging device having a global shutter function. An overall structure of the solid-state imaging device according to this modification example is not shown because it is the same as in FIG. 20. FIG. 22 is a cross-sectional view of the solid-state imaging device 101 according to this modification example for one pixel.

As shown in FIG. 22, the solid-state imaging device 101 includes a first substrate 180 on which a photoelectric conversion unit PD is formed and a second substrate 181 on which a charge accumulated capacitance part 153 and a plurality of MOS transistors are formed. Therefore, the first substrate 180 and the second substrate 181 are laminated and bonded. In addition, the side of the first substrate 180 on which the photoelectric conversion unit PD is formed constitutes the light incident surface on which light L is incident, and a color filter 159 and an on-chip lens 160 are formed on the light incident surface of the first substrate 180.

The configuration of the first substrate 180 and the second substrate 181 will be described in detail with reference to FIGS. 23A and 23B.

First, the first substrate 180 will be described.

Figure 23A:
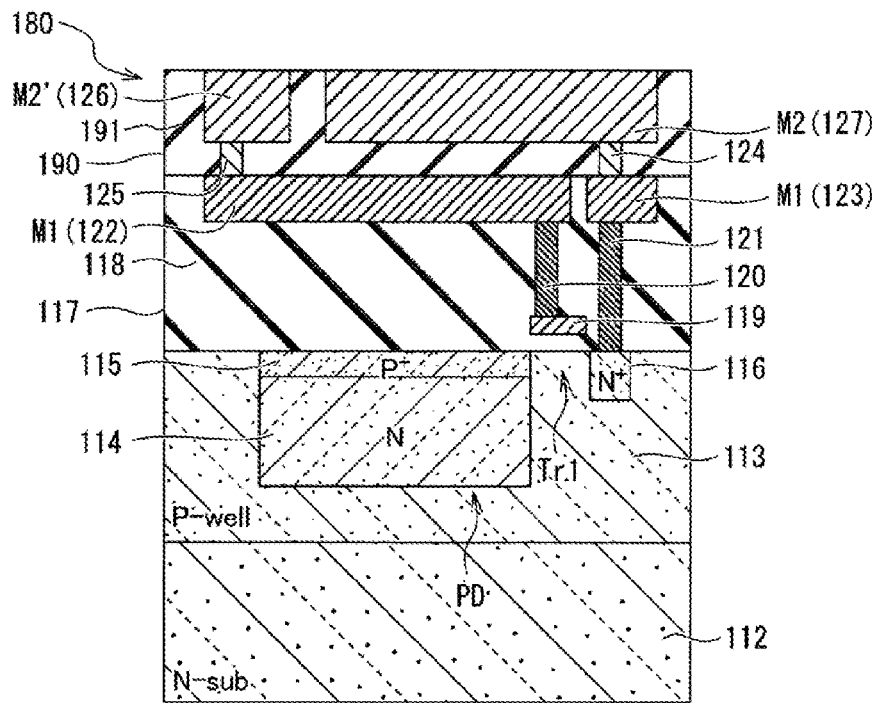
FIG. 23A is a cross-sectional view showing an enlarged first substrate.

As shown in FIG. 23A, the first substrate 180 is composed of a photoelectric conversion unit PD, a semiconductor substrate 112 in which an impurity region 116, which is a drain of a first transfer transistor Tr1, is formed, a multilayer wiring layer 117 formed on the semiconductor substrate 112, and a region for substrate connection 190 formed on the multilayer wiring layer 117.

The semiconductor substrate 112 is formed of an N-type silicon substrate, and a P-type well layer 113 is formed on the semiconductor substrate 112. The P-type well layer 113 can be formed by ion implanting P-type impurities into the semiconductor substrate 112.

The photoelectric conversion unit PD is composed of an N-type well layer 114 formed on the P-type well layer 113, and a P+ type impurity region 115 which is a region in contact with the N-type well layer 114 and formed on the front surface side of the P-type well layer 113. The N-type well layer 114 is formed by ion implanting N-type impurities into a desired region of the P-type well layer 113. In addition, the P+ type impurity region 115 is formed by ion implanting P-type impurities at a high concentration in a desired region of the P-type well layer 113.

In the photoelectric conversion unit PD, a hole accumulation diode (HAD: registered trademark) structure is formed according to the effects of the pn junction between the P+ type impurity region 115 and the N-type well layer 114, and the pn junction between the N-type well layer 114 and the P-type well layer 113.

In the photoelectric conversion unit PD having such a configuration, a signal charge corresponding to the light intensity of incident light L is generated, and the photoelectrically converted signal charge is accumulated in the depletion layer formed between the P+ type impurity region 115 and the N-type well layer 114.

The impurity region 116 is formed on the front surface side of the P-type well layer 113 in a region separated from the photoelectric conversion unit PD by a predetermined distance, and is a region in which the signal charge transferred from the photoelectric conversion unit PD is temporarily accumulated. The impurity region 116 is formed by ion implanting N-type impurities at a high concentration in a desired region of the P-type well layer 113.

In this modification example, the region between the photoelectric conversion unit PD and the impurity region 116 is defined as a channel unit of the first transfer transistor Tr1.

The multilayer wiring layer 117 is formed on the P-type well layer 113 in which the photoelectric conversion unit PD and the impurity region 116 are formed, on the semiconductor substrate 112. In the multilayer wiring layer 117, a gate electrode 119 constituting the first transfer transistor Tr1 and a first wiring layer M1 formed on the gate electrode 119 are laminated with an interlayer insulating film 118 therebetween.

The gate electrode 119 is formed on the channel unit between the photoelectric conversion unit PD and the impurity region 116 formed in the P-type well layer 113 with a gate insulating film (not shown) therebetween.

In the first wiring layer M1, a first connection wiring 123 and a second connection wiring 122 are formed. The first connection wiring 123 is connected to the impurity region 116 with a contact part 121 formed in the interlayer insulating film 118 therebetween. In addition, the second connection wiring 122 is connected to the gate electrode 119 with a contact part 120 therebetween formed in the interlayer insulating film 118.

The region for substrate connection 190 is formed on the first wiring layer M1 in the multilayer wiring layer 117. In the region for substrate connection 190, a second wiring layer M2 is laminated on the first wiring layer M1 with an interlayer insulating film 191 therebetween.

In the second wiring layer M2, a first connection electrode 127 and a second connection electrode 126 are formed, and the first connection electrode 127 and the second connection electrode 126 are formed to be exposed at the front surface of the multilayer wiring layer 117. The first connection electrode 127 is connected to the first connection wiring 123 formed of the first wiring layer M1 with a contact part 124 formed in the interlayer insulating film 191. In addition, the second connection electrode 126 is connected to the second connection wiring 122 formed of the first wiring layer M1 with a contact part 125 formed in the interlayer insulating film 191 therebetween.

In the first substrate 180 having the above configuration, the side opposite to the side of the semiconductor substrate 112 on which the first connection electrode 127 and the second connection electrode 126 are formed is the light incident side.

Next, the second substrate 181 will be described.

Figure 23B:
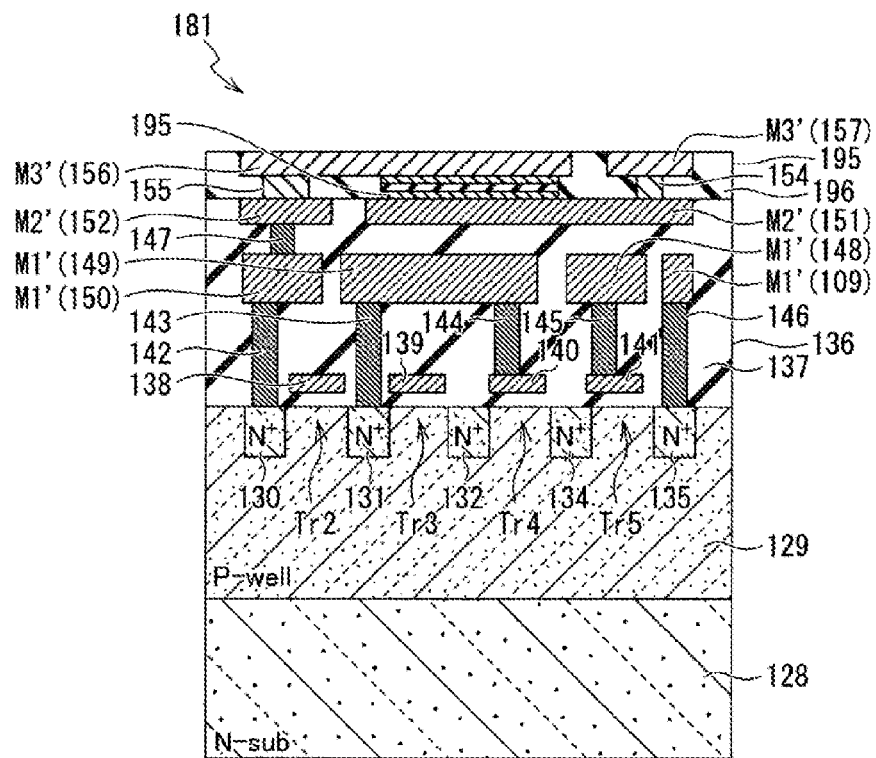
FIG. 23B is a cross-sectional view showing an enlarged second substrate.

As shown in FIG. 23B, the second substrate 181 is composed of a semiconductor substrate 128 on which impurity regions 130, 131, 132, 134, and 135, which are sources/drains of a plurality of MOS transistors, are formed, a multilayer wiring layer 136 formed on the semiconductor substrate 128, and a region for substrate connection 195 formed on the multilayer wiring layer 136. Therefore, the charge accumulated capacitance part 153 is formed in the region for substrate connection 195. In this modification example, the plurality of MOS transistors formed in the second substrate 181 are a second transfer transistor Tr2, a reset transistor Tr3, an amplifying transistor Tr4, and a select transistor Tr5.

The semiconductor substrate 128 is formed of an N-type silicon substrate, and a P-type well layer 129 is formed on the semiconductor substrate 128. The P-type well layer 129 can be formed by ion implanting P-type impurities into the semiconductor substrate 128.

The impurity regions 130, 131, 132, 134, and 135 constituting the second transfer transistor Tr2, the reset transistor Tr3, the amplifying transistor Tr4, and the select transistor Tr5 are formed in desired regions on the front surface side of the P-type well layer 129. These impurity regions 130, 131, 132, 134, and 135 are formed by ion implanting N-type impurities at a high concentration in a desired region of the P-type well layer 129.

The impurity region 130 is used as the source of the second transfer transistor Tr2. In addition, the impurity region 131 is shared by the drain of the second transfer transistor Tr2 and the source of the reset transistor Tr3, and is used as a floating diffusion region in which the signal charge is read. In addition, the impurity region 132 shared by the drain of the reset transistor Tr3 and the source of the amplifying transistor Tr4. In addition, the impurity region 134 is shared by the drain of the amplifying transistor Tr4 and the source of the select transistor Tr5. In addition, the impurity region 135 serves as the drain of the select transistor Tr5. Therefore, the region of the P-type well layer 129 between the impurity regions 130, 131, 132, 134, and 135 is used as a channel unit constituting each MOS transistor.

The multilayer wiring layer 136 is formed on the P-type well layer 129 in which the impurity regions 130, 131, 132, 134, and 135 are formed, on the semiconductor substrate 128. In the multilayer wiring layer 136, gate electrodes 138, 139, 140, and 141 constituting MOS transistors, a first wiring layer M1' and a second wiring layer M2' are laminated with an interlayer insulating film 137 therebetween.

The gate electrodes 138, 139, 140, and 141 are formed on the channel unit constituting each MOS transistor with a gate insulating film (not shown) therebetween. The gate electrode 138 formed on the P-type well layer 129 between the impurity region 130 and the impurity region 131 is the gate electrode 138 of the second transfer transistor Tr2. In addition, the gate electrode 139 formed on the P-type well layer 129 between the impurity region 131 and the impurity region 132 is used as the gate electrode of the reset transistor Tr3. In addition, the gate electrode 140 formed on the P-type well layer 129 between the impurity region 132 and the impurity region 134 is used as the gate electrode of the amplifying transistor Tr4. In addition, the gate electrode 141 formed on the P-type well layer 129 between the impurity region 134 and the impurity region 135 is used as the gate electrode of the select transistor Tr5.

The first wiring layer M1' is formed on the gate electrodes 138, 139, 140, and 141 with the interlayer insulating film 137 therebetween, and in the first wiring layer M1', a first connection wiring 150, a second connection wiring 149, a selection wiring 148, and the vertical signal line 109 (refer to FIG. 20) are formed. The first connection wiring 150 is connected to the impurity region 130 as the source of the second transfer transistor Tr2 with a contact part 142 formed in the interlayer insulating film 137 therebetween. The second connection wiring 149 is connected to the impurity region 131 and the gate electrode 140 of the amplifying transistor Tr4 with contact parts 143 and 144 formed in the interlayer insulating film 137 therebetween. That is, the impurity region 131, which is a floating diffusion region, and the gate electrode 140 of the amplifying transistor Tr4 are electrically connected by the second connection wiring 149. In addition, the selection wiring 148 is connected to the gate electrode 141 of the select transistor Tr5 with a contact part 145 formed in the interlayer insulating film 137 therebetween. Therefore, a selection pulse is supplied from the selection wiring 148 to the gate electrode 141 of the select transistor Tr5. In addition, the vertical signal line 109 (refer to FIG. 20) is connected to the impurity region 135, which is the drain of the select transistor Tr5, with a contact part 146 formed in the interlayer insulating film 137.

In the second wiring layer M2', a third connection wiring 152 and a fourth connection wiring 151 are formed. The third connection wiring 152 is connected to the first connection wiring 150 with a contact part 147 formed in the interlayer insulating film 137. In addition, the fourth connection wiring 151 is formed to extend to a predetermined region. In addition, a first transfer wiring formed in the multilayer wiring layer 136 of the second substrate 181 (not shown) is connected to the fourth connection wiring 151, and a first transfer pulse is supplied from the first transfer wiring to the fourth connection wiring 151.

The region for substrate connection 195 is formed on the third connection wiring 152 and the fourth connection wiring 151, in the multilayer wiring layer 136. In the region for substrate connection 195, the charge accumulated capacitance part 153 is formed on the third connection wiring 152 and the fourth connection wiring 151 of the second wiring layer M2', and a third wiring layer M3' is formed on the second wiring layer M2' with the charge accumulated capacitance part 153 therebetween. That is, the charge accumulated capacitance part 153 is interposed between the second wiring layer M2' and the third wiring layer M3'. As the charge accumulated capacitance part 153, a capacitor having an MIM structure can be used.

In the third wiring layer M3', a first connection electrode 156 and a second connection electrode 157 are formed, and the first connection electrode 156 and the second connection electrode 157 are formed to be exposed at the front surface of the region for substrate connection 195. The first connection electrode 156 is connected to the third connection wiring 152 formed of the second wiring layer M2' with a contact part 155 formed in an interlayer insulating film 196 therebetween, and is formed so that it extends on the fourth connection wiring 151 formed of the second wiring layer M2' with the charge accumulated capacitance part 153 therebetween. In addition, the second connection electrode 157 is connected to the fourth connection wiring 151 formed of the second wiring layer M2' with a contact part 154 formed in the interlayer insulating film 196 therebetween.

Here, although not shown in FIG. 23B, a second transfer wiring for supplying a second transfer pulse is connected to the gate electrode 138 of the second transfer transistor Tr2. Similarly, a reset wiring for supplying a reset pulse is also connected to the gate electrode 139 of the reset transistor Tr3. Therefore, the second transfer wirings and the reset wiring are formed by a desired wiring layer formed in the multilayer wiring layer 136.

Therefore, the solid-state imaging device 101 of this modification example is formed by laminating the first substrate 180 on the second substrate 181 so that the first connection electrodes 156 and 127, and the second connection electrodes 157 and 126 of the first substrate 180 and the second substrate 181 are connected to each other. Therefore, when the first substrate 180 and the second substrate 181 are bonded, the impurity region 116 constituting the first transfer transistor Tr1, the charge accumulated capacitance part 153, and the impurity region 130 constituting the second transfer transistor Tr2 are electrically connected. In addition, in the solid-state imaging device 101 of this modification example, when the first substrate 180 and the second substrate 181 are laminated and bonded, the photoelectric conversion unit PD and the charge accumulated capacitance part 153 are three-dimensionally laminated.

In addition, in the solid-state imaging device 101 of this modification example, the first connection electrode 156 serves as a light-blocking film, and the impurity region 130 as the source of the second transfer transistor Tr2 is shielded from light by the first connection electrode 156. Therefore, since the amount of light incident on the impurity region 130 is reduced, and generation of unnecessary signal charges is minimized, color mixing is reduced. Thus, in this case, all regions except the opening of the photoelectric conversion unit PD are preferably shielded from light.

Figure 24:
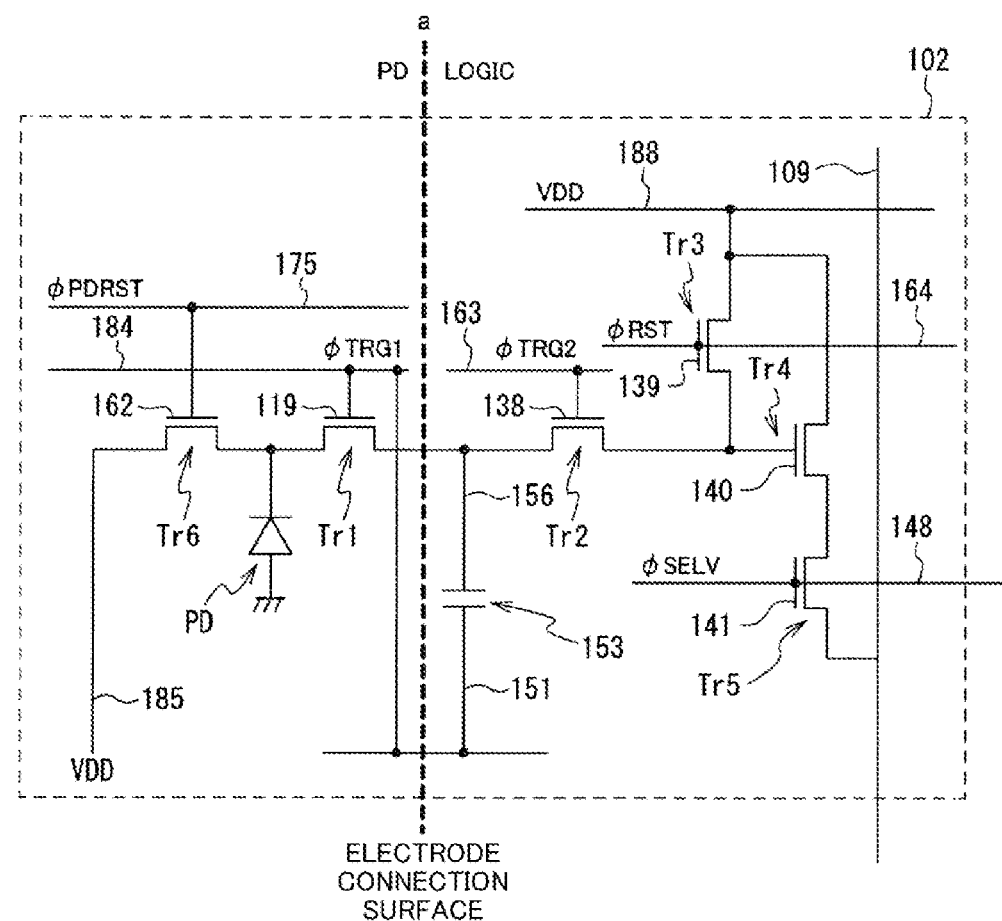
FIG. 24 is a circuit diagram showing a circuit configuration of a solid-state imaging device for one pixel.
Figure 25:
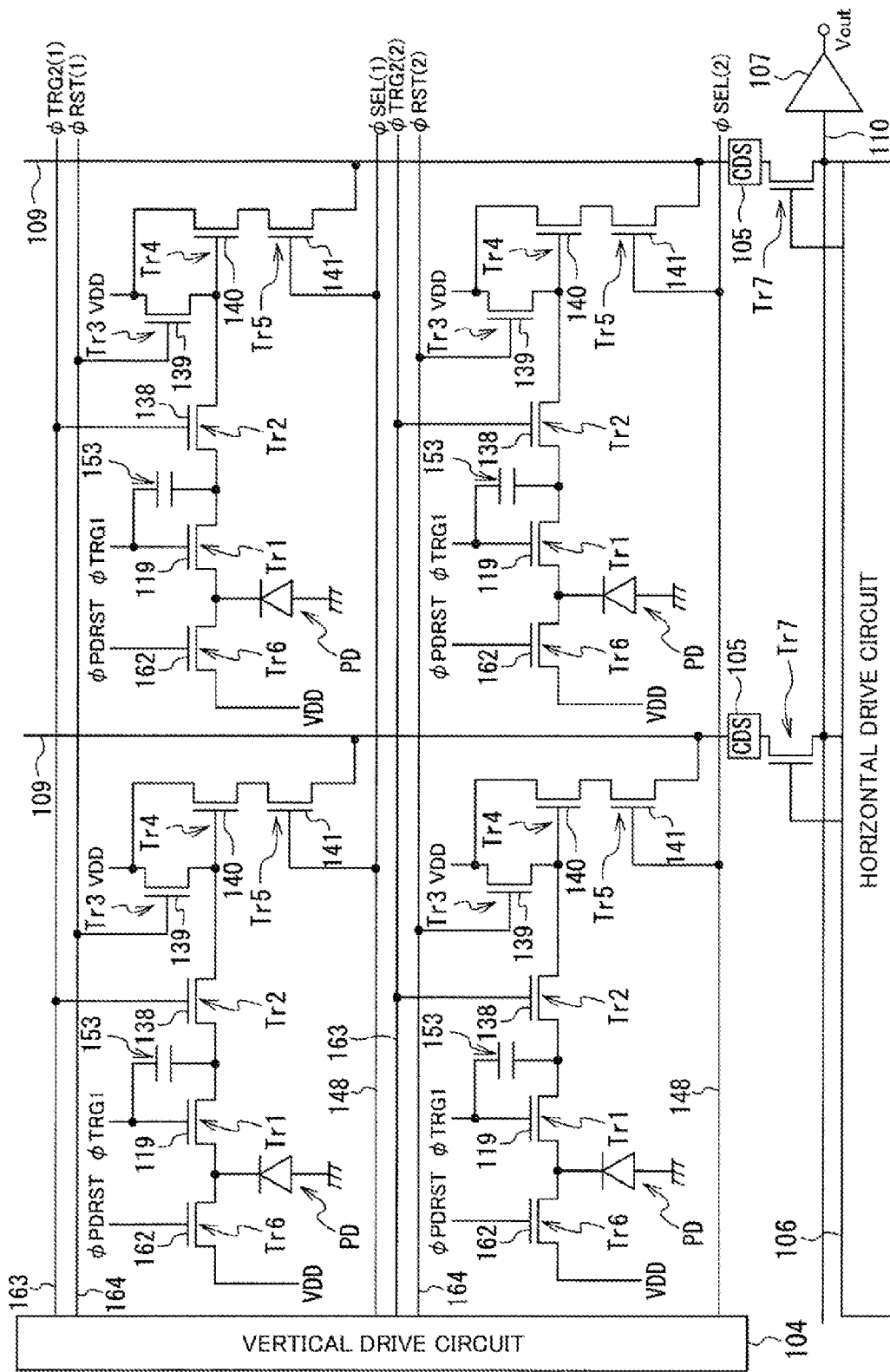
FIG. 25 is a circuit diagram showing a circuit configuration of a solid-state imaging device for 4 pixels in two rows and two columns.

Next, a method of driving the solid-state imaging device 101 of this modification example will be described with reference to FIG. 24. FIG. 24 is a circuit configuration of the solid-state imaging device 101 of this modification example for one pixel, and FIG. 25 is a circuit configuration for 4 pixels in two rows and two columns adjacent to each other.

The line a in FIG. 24 indicates an electrode connection surface between the first connection electrode 127 and the second connection electrode 126 formed in the first substrate 180, and the first connection electrode 156 and the second connection electrode 157 formed in the second substrate 181.

The side of the anode of the photodiode, which is a photoelectric conversion unit PD, is grounded, and the side of the cathode is connected to the source of the first transfer transistor Tr1. In addition, although not shown in FIG. 22, as shown in FIG. 24 and FIG. 25, in the first substrate 180, a reset transistor for a photoelectric conversion unit Tr6 is formed, and the drain of the reset transistor for a photoelectric conversion unit Tr6 is connected to the side of the cathode of the photoelectric conversion unit PD. A power supply voltage wiring 185 for applying a power supply voltage VDD is connected to the source of the reset transistor for a photoelectric conversion unit Tr6. In addition, a reset wiring 175 for supplying a reset pulse φ PDRST is connected to a gate electrode 162 of the reset transistor for a photoelectric conversion unit Tr6.

The drain of the first transfer transistor Tr1 is connected to the source of the second transfer transistor Tr2 with the first connection electrode 156 connected to one electrode of the charge accumulated capacitance part 153 therebetween. A first transfer wiring 184 for supplying a first transfer pulse φ TRG1 is connected to the gate electrode 119 of the first transfer transistor Tr1. In addition, the first transfer wiring 184 is connected to the fourth connection wiring 151 connected to the other electrode of the charge accumulated capacitance part 153.

The drain of the second transfer transistor Tr2 is connected to the source of the reset transistor Tr3, and also connected to the gate electrode 140 of the amplifying transistor Tr4. A second transfer wiring 163 for supplying a second transfer pulse φ TRG2 is connected to the gate electrode 138 of the second transfer transistor Tr2.

A power supply voltage wiring 188 for applying a power supply voltage VDD is connected to the drain of the reset transistor Tr3, and a reset wiring 164 for supplying a reset pulse φ RST is connected to the gate electrode 139 of the reset transistor Tr3.

The power supply voltage wiring 188 for applying a power supply voltage VDD is connected to the source of the amplifying transistor Tr4, and the drain of the amplifying transistor Tr4 is connected to the source of the select transistor Tr5.

The selection wiring 148 for supplying a selection pulse φ SEL is connected to the gate electrode 141 of the select transistor Tr5, and the drain of the select transistor Tr5 is connected to the vertical signal line 109 (refer to FIG. 20).

Therefore, as shown in FIG. 25, in the solid-state imaging device 101 in which the pixels 102 are arranged in a 2D matrix form, the second transfer wiring 163, the reset wiring 164, and the selection wiring 148 common to each row are connected to the gate electrodes 138, 139, and 141. Therefore, the second transfer pulse φ TRG2, the reset pulse φ RST, and the selection pulse φ SEL input to the gate electrodes 138, 139, and 141 are supplied from the vertical drive circuit 104. Although not shown, the reset pulse φ PDRST supplied to the gate electrode 162 of the reset transistor for a photoelectric conversion unit Tr6 and the first transfer pulse φ TRG1 supplied to the gate electrode 119 of the first transfer transistor Tr1 are also supplied by the vertical drive circuit 104.

In addition, the vertical signal line 109 (refer to FIG. 20) common to each column is connected to the drain of the select transistor Tr5.

The column signal processing circuit 105 provided for each column is connected to a stage after the vertical signal line 109. Therefore, a horizontal transistor Tr7 to which a horizontal selection pulse from the horizontal drive circuit 106 is input is connected to a stage after the column signal processing circuit 105.

Figure 26:
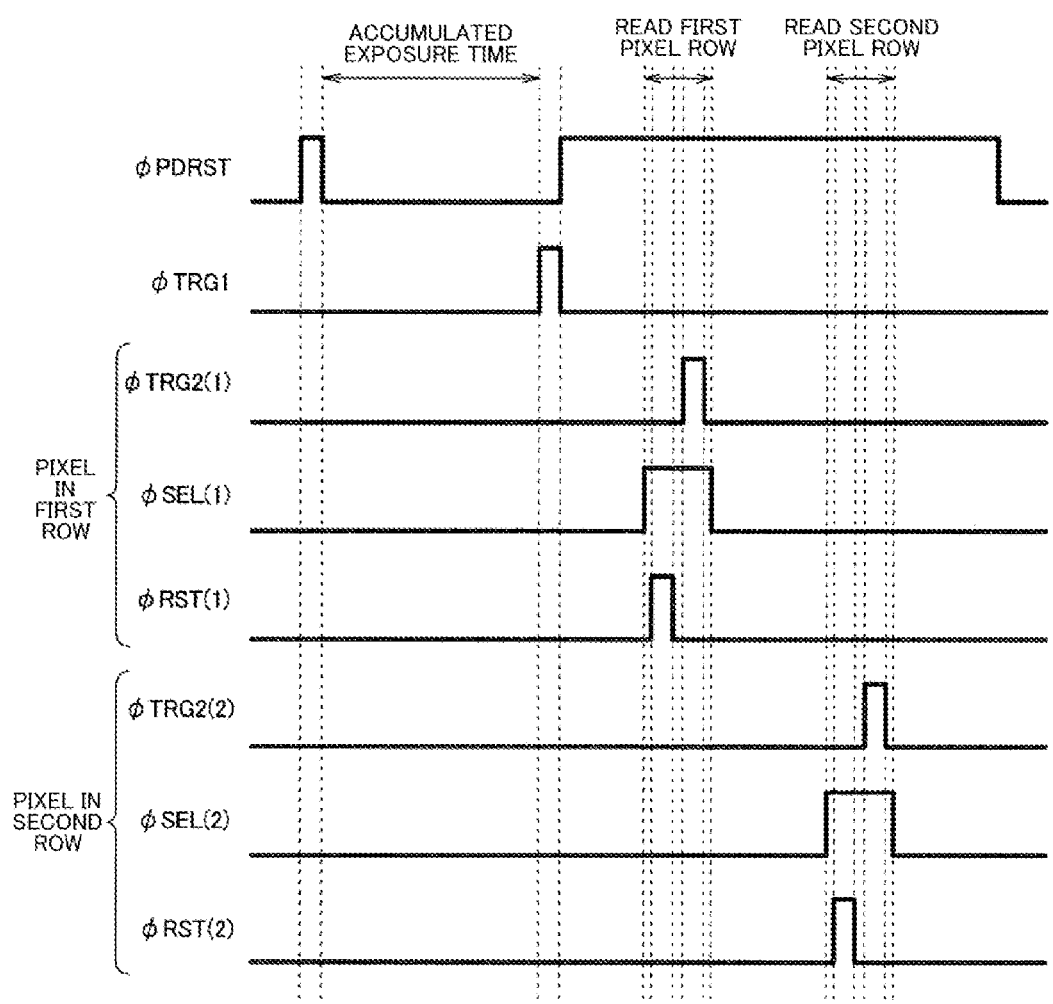
FIG. 26 is a timing chart illustrating a method of driving a solid-state imaging device.

Next, a method of driving the solid-state imaging device 101 having the above circuit configuration will be described using the timing chart shown in FIG. 26 and the circuit configuration of FIG. 25.

First, the reset pulse φ PDRST is set to high, and the reset transistors for a photoelectric conversion unit Tr6 of all pixels are turned on at the same time, and thus the potential of the photoelectric conversion unit PD of all pixels is reset to the same potential as the power supply voltage VDD. That is, according to this operation, unnecessary charges stored in the photoelectric conversion unit PD of all pixels are discharged, and the potential of the photoelectric conversion unit PD is reset to a certain value (VDD).

Next, the reset pulse φ PDRST is set to low, and the reset transistors for a photoelectric conversion unit Tr6 of all pixels are tuned off at the same time, and generation and accumulation of signal charges are started in the photoelectric conversion unit PD of all pixels. A signal charge is generated according to the light intensity of light incident on the photoelectric conversion unit PD, and the generated signal charge is accumulated in the well of the potential that can be generated by the effect of the pn junction in the photoelectric conversion unit PD. In this case, it is assumed that the signal charge stored in the charge accumulated capacitance part 153 is sequentially read during previous reading, and the charge accumulated capacitance part 153 becomes empty, but a timing at which the charge accumulated capacitance part 153 is reset may be provided separately.

Next, before a predetermined accumulation time has elapsed after the reset pulse φ PDRST is set to low, the first transfer pulse φ TRG1 is set to high, the first transfer transistors Tr1 of all pixels are turned on at the same time, and the signal charge stored in the photoelectric conversion unit PD is transferred to the impurity region 116. Then, since the impurity region 116, the impurity region 130, and the charge accumulated capacitance part 153 are electrically connected, the signal charge is temporarily accumulated in the impurity region 116, the impurity region 130, and the charge accumulated capacitance part 153 formed in the first substrate 180. In addition, in this manner, while the first transfer pulse φ TRG1 is set to high, the signal charge is mainly accumulated in the charge accumulated capacitance part 153.

Then, the first transfer pulse φ TRG1 is set to low and the first transfer transistors Tr1 of all pixels are turned off, and thus the signal charge mainly accumulated in the charge accumulated capacitance part 153 is transferred to the depletion layer of the impurity region 116 and the impurity region 130. As shown in FIG. 26, a time from when the reset pulse φ PDRST is set to low until the first transfer pulse φ TRG1 is set to low again is an accumulated exposure time (electronic shutter time). Here, when the first transfer pulse φ TRG1 is set to high, and the signal charge is transferred from the photoelectric conversion unit PD to the charge accumulated capacitance part 153, the potential of the first transfer pulse φ TRG1 is set to a potential at which the signal charge from the photoelectric conversion unit PD can be completely transferred.

Next, the reset pulse φ PDRST is set to high, the reset transistors for a photoelectric conversion unit Tr6 of all pixels are turned on, and the photoelectric conversion unit PD is reset. Thereby, while the signal charge stored in the charge accumulated capacitance part 153 is read, the amount of the signal charge that is accumulated in the photoelectric conversion unit PD in excess of the maximum accumulated charge amount of the photoelectric conversion unit PD is prevented from overflowing to the charge accumulated capacitance part 153. Alternatively, the photoelectric conversion unit PD is reset to the same potential as the power supply voltage VDD in preparation for the next signal charge accumulation. While the signal charge is accumulated in the charge accumulated capacitance part 153, and the impurity regions 116 and 130, as the potential of the first transfer pulse φ TRG1, a potential that forms an inversion layer on the front surface of the charge accumulated capacitance part 153 may be applied. Thereby, generation of a dark current can be minimized during accumulation of the signal charge.

Then, the selection pulse φ SEL(1) is set to high, the select transistor Try in the first row is turned on, and the pixel 102 in the first row is selected. When the selection pulse φ SEL(1) in the first row is set to high, the reset pulse φ RST(1) is set to high, and the reset transistor Tr3 in the first row is turned on. Thereby, the potential of the impurity region 131, which is a floating diffusion region connected to the gate electrode 140 of the amplifying transistor Tr4, is reset to the same potential as the power supply voltage VDD. In this case, the output when the amplifying transistor Tr4 is reset is stored in the column signal processing circuit 105 via the vertical signal line 109 (refer to FIG. 20).

Next, the second transfer pulse φ TRG2(1) is set to high, the second transfer transistor Tr2 of the pixel 102 in the first row is turned on, and the signal charges in the impurity region 130 and the impurity region 116 of the pixel 102 in the first row are transferred to the impurity region 131, which is a floating diffusion region. In this case, the potential of the second transfer pulse φ TRG2(1) is set to a potential at which the signal charge can be completely transferred from the impurity region 130 and the impurity region 116 to the impurity region 131. When the signal charge is read in the impurity region 131, the potential of the impurity region 131, which is a floating diffusion region, changes, and the signal voltage according to the potential change is applied to the gate electrode 140 of the amplifying transistor Tr4. Therefore, the signal voltage amplified by the amplifying transistor Tr4 is output to the vertical signal line 109 (refer to FIG. 20).

Therefore, the signal voltage output to the vertical signal line 109 (refer to FIG. 20) is sent to the column signal processing circuit 105. In the column signal processing circuit 105, the difference between the output during reset stored earlier and the amplified signal voltage is output as a pixel signal of the pixel 102 in the first row. Therefore, when the horizontal transistor Tr7 is sequentially turned on by the horizontal drive circuit 106, the pixel signals of the pixels 102 in the first row are serially output from the output terminal Vout through the output circuit 107 (refer to FIG. 20).

Then, after the selection pulse φ SEL(1) is set to low, the selection pulse φ SEL(2) is set to high, the select transistor Tr5 in the second row is turned on, and the pixel 102 in the second row is selected. When the selection pulse φ SEL(2) of the select transistor Tr5 in the second row is set to high, the state of the second transfer pulse φ TRG2(2) and the reset pulse φ RST(2) is driven in the same manner as in the second transfer pulse φ TRG2(1) and the reset pulse φ RST(1) in the first row. Thereby, for the pixel 102 in the second row, the same read operation as in the first row described above is performed.

As can be understood from the above description, in the solid-state imaging device 101 of this modification example, the accumulated exposure time for generating and accumulating the signal charge in the photoelectric conversion unit PD is the same time for all pixels. That is, since each pixel 102 has the charge accumulated capacitance part 153, the electronic shutter operation (global shutter operation) can be performed for all pixels at the same time. Therefore, the signal charges accumulated at the same time for all pixels are accumulated and kept in each charge accumulated capacitance part 153, read in the impurity region 131 in line sequence, and the signal voltage amplified according to the potential of the signal charge is output via the vertical signal line 109 (refer to FIG. 20).

An example of the solid-state imaging device to which the technology according to the present disclosure can be applied has been described above. The technology according to the present disclosure can be applied to the first substrate 180, the second substrate 181, the first connection electrode 127, the first connection electrode 156 and the charge accumulated capacitance part 153 within the configuration described above. Specifically, the first substrate 2 in FIG. 1 can be applied to the first substrate 180 in FIG. 22, the second substrate 3 in FIG. 1 can be applied to the second substrate 181, the first electrode pad 8 in FIG. 1 can be applied to the first connection electrode 127 in FIG. 22, the second electrode 17 in FIG. 1 can be applied to the first connection electrode 156 in FIG. 22, and the second capacitor 20 in FIG. 1 can be applied to the charge accumulated capacitance part 153 in FIG. 22. Thereby, according to the second capacitor 20 in FIG. 1, the charge accumulated capacitance part 153 for accumulating the signal charge generated in the photoelectric conversion unit PD when the global shutter operation is executed can be formed. When the technology according to the present disclosure is applied to the first substrate 180, the second substrate 181, the first connection electrode 127, the first connection electrode 156 and the charge accumulated capacitance part 153, since deterioration of performance of the capacitor (the charge accumulated capacitance part 153) due to the bonding process can be minimized, a better captured image can be obtained.

Here, in this modification example, an example in which the charge accumulated capacitance part 153 is formed in the region for substrate connection 195 of the second substrate 181 is shown, but other configurations can be used. For example, it may be formed in the region for substrate connection 190 of the first substrate 180. When formed in the region for substrate connection 190, the first capacitor 10 in FIG. 1 can be applied to the charge accumulated capacitance part 153. Thereby, according to the first capacitor 10 in FIG. 1, the charge accumulated capacitance part 153 for accumulating the signal charge generated in the photoelectric conversion unit PD when the global shutter operation is executed can be formed.

3. Example of Application to Electronic Device

The technology according to the present disclosure (the present technology) may be applied to various electronic devices, for example, an imaging device such as a digital still camera and a digital video camera, a mobile phone having an imaging function, or another device having an imaging function.

Figure 27:
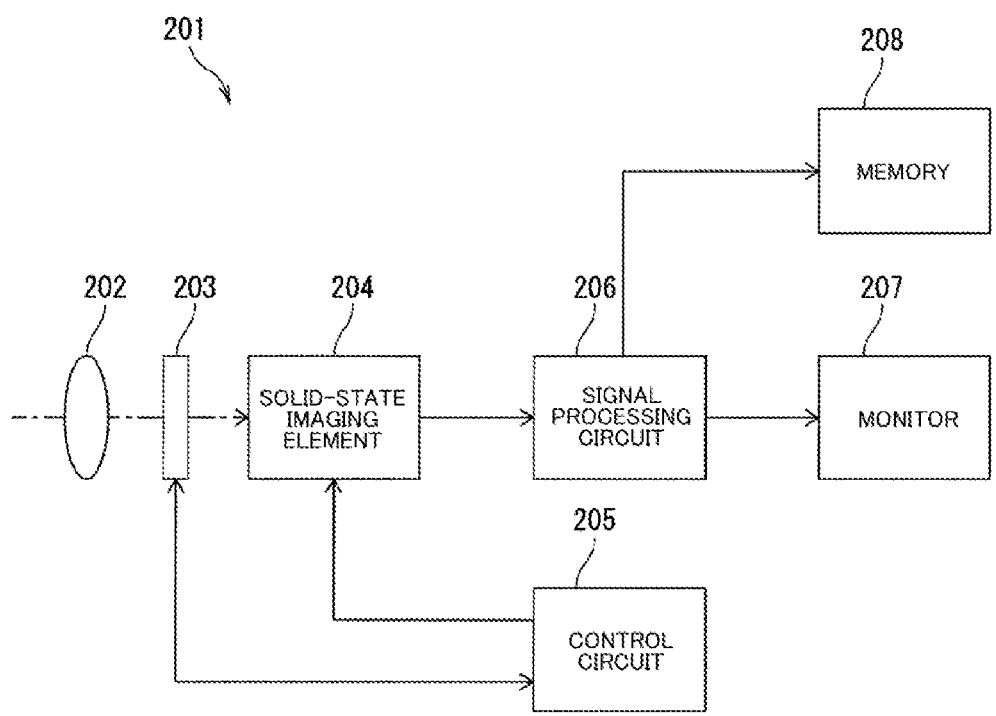
FIG. 27 is a diagram showing an example of a schematic configuration of an electronic device.

FIG. 27 is a diagram showing an example of a schematic configuration of an imaging device as an electronic device to which the technology according to the present disclosure (the present technology) can be applied.

As shown in FIG. 27, an imaging device 201 includes an optical system 202, a shutter device 203, a solid-state imaging element 204, a drive circuit 205, a signal processing circuit 206, a monitor 207, and a memory 208, and can capture still images and moving images.

The optical system 202 includes one or more lenses, and guides light (incident light) from a subject to the solid-state imaging element 204, and forms an image on the light receiving surface of the solid-state imaging element 204.

The shutter device 203 is arranged between the optical system 202 and the solid-state imaging element 204, and controls a light emission period and a light-blocking period for the solid-state imaging element 204 according to the control of the drive circuit 205.

The solid-state imaging element 204 is formed by a package including the above solid-state imaging element 204. The solid-state imaging element 204 accumulates signal charges for a certain period according to light formed into an image on the light receiving surface via the optical system 202 and the shutter device 203. The signal charge accumulated in the solid-state imaging element 204 is transferred according to the drive signal (timing signal) supplied from the drive circuit 205. The drive circuit 205 outputs a drive signal that controls the transfer operation of the solid-state imaging element 204 and the shutter operation of the shutter device 203, and drives the solid-state imaging element 204 and the shutter device 203. The signal processing circuit 206 performs various types of signal processing on the signal charge output from the solid-state imaging element 204. The image (image data) obtained by signal processing performed by the signal processing circuit 206 is supplied to and displayed on the monitor 207, and supplied and stored (recorded) in the memory 208.

An example of the electronic device (imaging device) to which the technology according to the present disclosure can be applied has been described above. The technology according to the present disclosure can be applied to the solid-state imaging element 204 within the configuration described above. Specifically, the image sensor in FIG. 21 and FIG. 22 can be applied to the solid-state imaging element 204. When the technology according to the present disclosure is applied to the solid-state imaging element 204, since deterioration of performance of the capacitor due to the bonding process can be minimized, a better captured image can be obtained.

4. Example of Application to Moving Object

The technology according to the present disclosure (the present technology) may be applied to devices mounted in any type of moving objects, for example, automobiles, electric vehicles, hybrid electric vehicles, motorcycles, bicycles, personal mobilities, airplanes, drones, ships, and robots.

Figure 28:
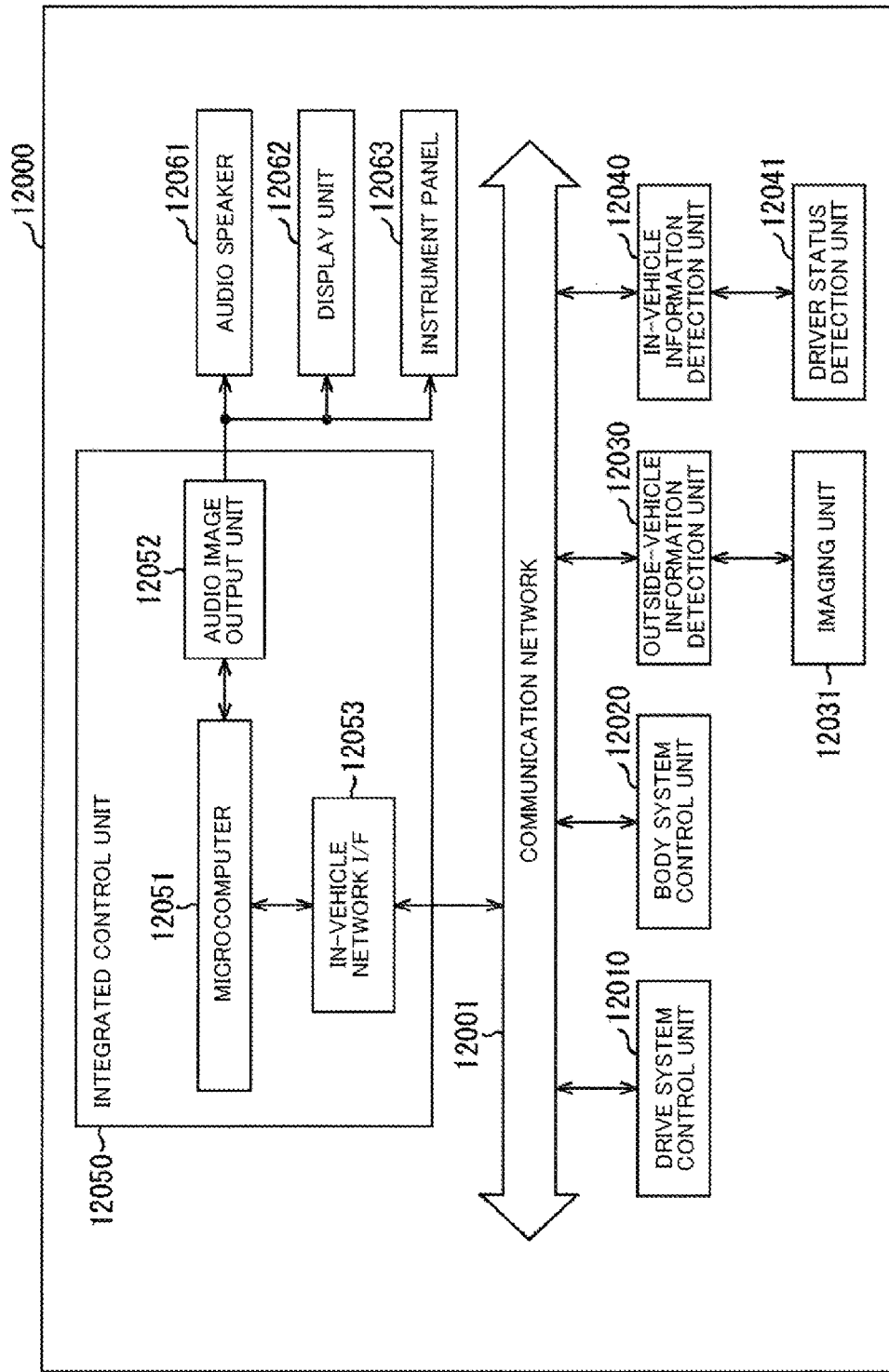
FIG. 28 is a block diagram showing an example of a schematic configuration of a vehicle control system.

FIG. 28 is a block diagram showing a schematic configuration example of a vehicle control system, which is an example of a moving object control system to which the technology according to the present disclosure can be applied.

A vehicle control system 12000 includes a plurality of electronic control units connected via a communication network 12001. In the example shown in FIG. 28, the vehicle control system 12000 includes a drive system control unit 12010, a body system control unit 12020, an outside-vehicle information detection unit 12030, an in-vehicle information detection unit 12040, and an integrated control unit 12050. In addition, as the functional configuration of the integrated control unit 12050, a microcomputer 12051, an audio image output unit 12052, and an in-vehicle network interface (I/F) 12053 are shown.

The drive system control unit 12010 controls the operation of a device related to a vehicle drive system according to various programs. For example, the drive system control unit 12010 functions as a control device for a driving force generating device for generating a driving force of a vehicle such as an internal combustion engine or a drive motor, a driving force transmission mechanism for transmitting a driving force to wheels, a steering mechanism for adjusting a steering angle of a vehicle, and a braking device for generating a braking force of a vehicle.

The body system control unit 12020 controls operations of various devices mounted in a vehicle body according to various programs. For example, the body system control unit 12020 functions as a control device such as a keyless entry system, a smart key system, a power window device, or various lamps such as a headlamp, a back lamp, a brake lamp, a turn signal and a fog lamp. In this case, radio waves transmitted from a portable device that substitutes for a key or signals of various switches may be input to the body system control unit 12020. The body system control unit 12020 receives such a radio wave or signal input, and controls a door lock device, a power window device, and a lamp of the vehicle.

The outside-vehicle information detection unit 12030 detects information outside the vehicle in which the vehicle control system 12000 is mounted. For example, an imaging unit 12031 is connected to the outside-vehicle information detection unit 12030. The outside-vehicle information detection unit 12030 causes the imaging unit 12031 to capture an image of the outside of the vehicle and receives the captured image. The outside-vehicle information detection unit 12030 may perform object detection processing or distance detection processing for peoples, cars, obstacles, signs, and letters on the road based on the received image.

The imaging unit 12031 is an optical sensor that receives light and outputs an electrical signal according to the intensity of the light received. The imaging unit 12031 can output an electrical signal as an image or output it as a distance measurement information. In addition, the light received by the imaging unit 12031 may be visible light or invisible light such as infrared rays.

The in-vehicle information detection unit 12040 detects information in the vehicle. In the in-vehicle information detection unit 12040, for example, a driver status detection unit 12041 that detects the driver's status is connected. The driver status detection unit 12041 includes, for example, a camera that images the driver, and the in-vehicle information detection unit 12040 may calculate the degree of fatigue or degree of concentration of the driver based on detection information input from the driver status detection unit 12041, and may determine whether the driver is asleep.

The microcomputer 12051 can calculate a control target value of the driving force generating device, the steering mechanism or the braking device based information inside and outside the vehicle acquired by the outside-vehicle information detection unit 12030 or the in-vehicle information detection unit 12040, and output a control command to the drive system control unit 12010. For example, the microcomputer 12051 can perform cooperative control in order to realize functions of an advanced driver assistance system (ADAS) such as following traveling, vehicle speed maintenance driving, vehicle collision warning, and vehicle lane deviation warning based on vehicle collision avoidance, impact mitigation, and inter-vehicle distance.

In addition, the microcomputer 12051 can perform cooperative control for automatic driving in which autonomous driving is performed without the operation of the driver by controlling the driving force generating device, the steering mechanism or the braking device based on information around the vehicle acquired by the outside-vehicle information detection unit 12030 or the in-vehicle information detection unit 12040.

In addition, the microcomputer 12051 can output a control command to the body system control unit 12020 based on the information outside the vehicle acquired by the outside-vehicle information detection unit 12030. For example, the microcomputer 12051 can perform cooperative control for antiglare such as switching a high beam to a low beam by controlling a headlamp according to a position of a preceding vehicle or an oncoming vehicle detected by the outside-vehicle information detection unit 12030.

The audio image output unit 12052 transmits an output signal of at least one of audio and an image to an output device that can visually or audibly notify the passenger of the vehicle or the outside of information. In the example shown in FIG. 28, as such an output device, an audio speaker 12061, a display unit 12062 and an instrument panel 12063 are shown. The display unit 12062 may include, for example, at least one of an onboard display and a head-up display.

Figure 29:
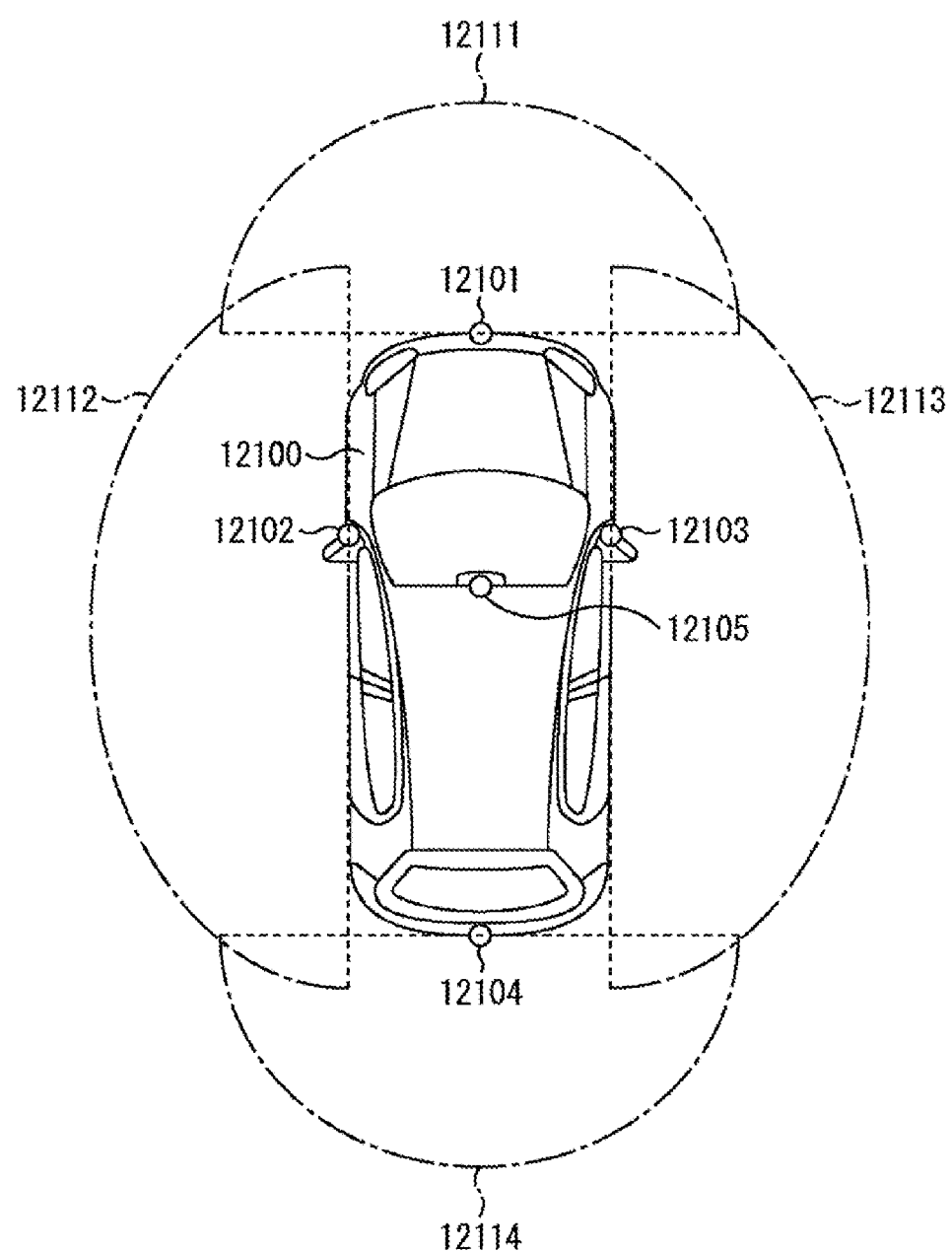
FIG. 29 is an explanatory diagram showing an example of installation positions of an outside-vehicle information detection unit and imaging units.

FIG. 29 is a diagram showing an example of an installation position of the imaging unit 12031.

In FIG. 29, a vehicle 12100 includes imaging units 12101, 12102, 12103, 12104, and 12105 as the imaging unit 12031.

The imaging units 12101, 12102, 12103, 12104, and 12105 are provided at positions, for example, the front nose, side mirrors, rear bumpers, back doors and the upper part of the windshield in the cabin of the vehicle 12100. The imaging unit 12101 provided in the front nose and the imaging unit 12105 provided in the upper part of the windshield in the cabin mainly acquire an image to the front of the vehicle 12100. The imaging units 12102 and 12103 provided in the side mirrors mainly acquire an image to the side of the vehicle 12100. The imaging unit 12104 provided in the rear bumper or the back door mainly acquires an image to the rear of the vehicle 12100. The front images acquired by the imaging units 12101 and 12105 are mainly used for detecting preceding vehicles, pedestrians, obstacles, traffic lights, traffic signs, lanes and the like.

Here, FIG. 29 shows an example of imaging ranges of the imaging units 12101 to 12104. An imaging range 12111 indicates an imaging range of the imaging unit 12101 provided in the front nose, imaging ranges 12112 and 12113 indicate imaging ranges of the imaging units 12102 and 12103 provided in the side mirror, respectively, and an imaging range 12114 indicates an imaging range of the imaging unit 12104 provided in the rear bumper or back door. For example, a bird's-eye view image of the vehicle 12100 from above can be obtained by superimposing image data captured by the imaging units 12101 to 12104.

At least one of the imaging units 12101 to 12104 may have a function of acquiring distance information. For example, at least one of the imaging units 12101 to 12104 may be a stereo camera including a plurality of imaging elements or an imaging element having pixels for phase difference detection.

For example, the microcomputer 12051 determines a distance to each three-dimensional object in the imaging ranges 12111 to 12114, and a change in the distance over time (a relative speed with respect to the vehicle 12100) based on the distance information obtained from the imaging units 12101 to 12104, and particularly, can extract a three-dimensional object that travels at a predetermined speed (for example, 0 km/h or more) in almost the same direction as the vehicle 12100, which is the closest three-dimensional object on the traveling path of the vehicle 12100, as a preceding vehicle. In addition, the microcomputer 12051 can set an inter-vehicle distance to be secured in advance in front of the preceding vehicle, and perform automatic brake control (including following stop control), automatic acceleration control (including following start control), and the like. In this manner, it is possible to perform cooperative control for automatic driving in which autonomous driving is performed without the operation of the driver.

For example, based on the distance information obtained from the imaging units 12101 to 12104, the microcomputer 12051 classifies the three-dimensional object data related to the three-dimensional object as a two-wheeled vehicle, an ordinary vehicle, a large vehicle, a pedestrian, a utility pole or another three-dimensional object and performs extraction, and can us the result for automatic avoidance of an obstacle. For example, the microcomputer 12051 distinguishes obstacle around the vehicle 12100 as obstacles that the driver of the vehicle 12100 can visually recognize and obstacles that are difficult for the driver to visually recognize. Therefore, the microcomputer 12051 determines collision risk indicating the degree of risk of collision with each obstacle, and when the collision risk is equal to or higher than the set value and there is a possibility of collision, an alarm is output to the driver through the audio speaker 12061 and the display unit 12062, forced deceleration and avoidance steering are performed through the drive system control unit 12010, and thus it is possible to perform driving support for collision avoidance.

At least one of the imaging units 12101 to 12104 may be an infrared camera that detects infrared rays. For example, the microcomputer 12051 can recognize a pedestrian by determining whether there is a pedestrian in the captured image of the imaging units 12101 to 12104. Such pedestrian recognition is performed by, for example, a procedure in which feature points in the captured images of the imaging units 12101 to 12104 as infrared cameras are extracted and a procedure in which pattern matching processing is performed on a series of feature points indicating the outline of the object and it is determined whether the object is a pedestrian. When the microcomputer 12051 determines that there is a pedestrian in the captured images of the imaging units 12101 to 12104, and the pedestrian is recognized, the audio image output unit 12052 controls the display unit 12062 so that the recognized pedestrian is superimposed and displayed with a square contour line for emphasis. In addition, the audio image output unit 12052 may control the display unit 12062 so that an icon indicating a pedestrian or the like is displayed at a desired position.

An example of the vehicle control system to which the technology according to the present disclosure can be applied has been described above. The technology according to the present disclosure can be applied to the imaging unit 12031 within the configuration described above. Specifically, the image sensor in FIG. 21 and FIG. 22 can be applied to the imaging unit 12031. When the technology according to the present disclosure is applied to the imaging unit 12031, since deterioration of the performance of the capacitor due to the bonding process can be minimized, a better captured image can be obtained, and fatigue of the driver can be reduced.

5. Example of Application to Endoscopic Surgery System

The technology according to the present disclosure (the present technology) may be applied to, for example, an endoscopic surgery system.

Figure 30:
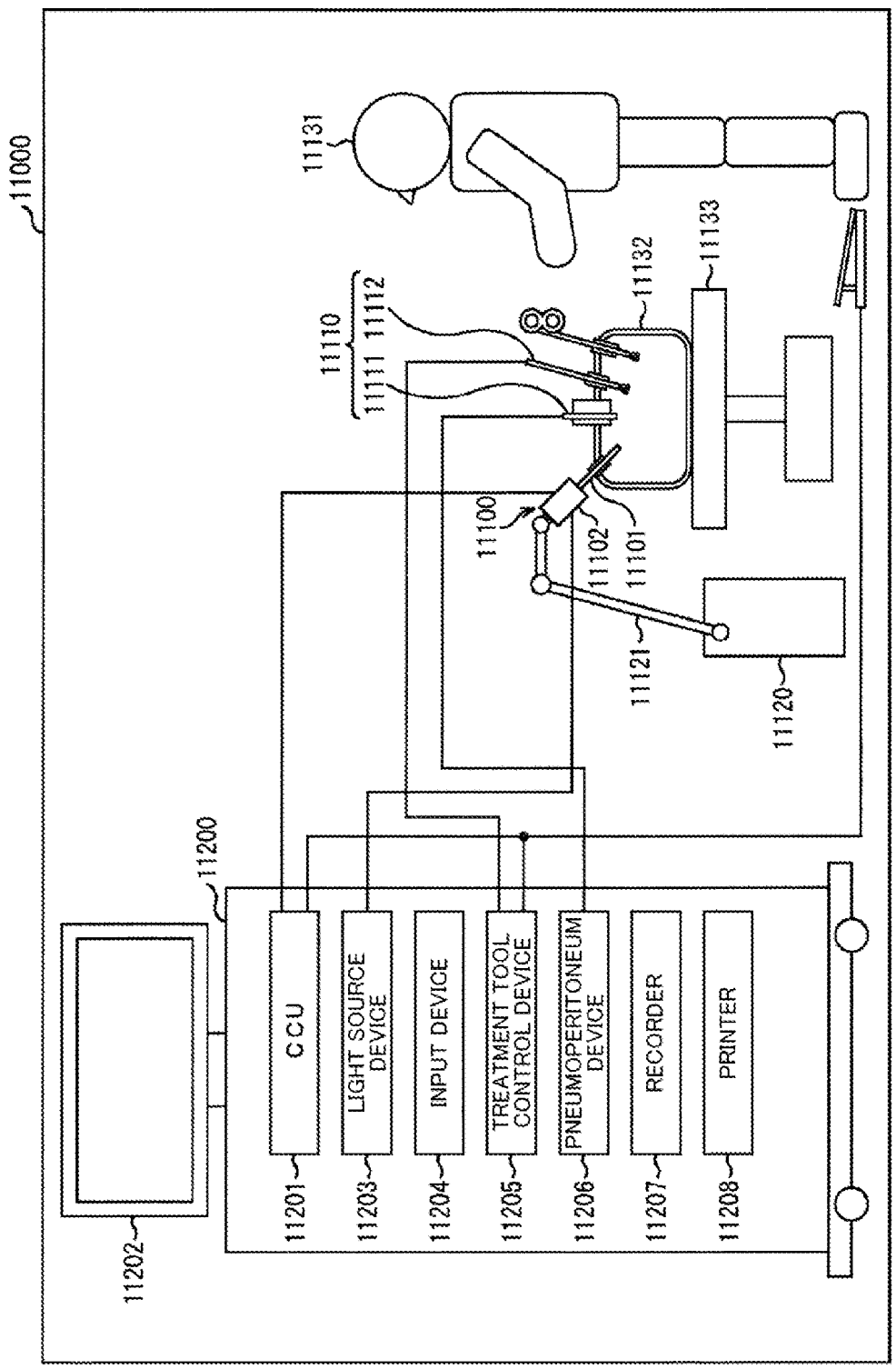
FIG. 30 is a diagram showing an example of a schematic configuration of an endoscopic surgery system.

FIG. 30 is a diagram showing an example of a schematic configuration of an endoscopic surgery system to which the technology according to the present disclosure (the present technology) can be applied.

FIG. 30 shows a case in which a surgeon (doctor) 11131 performs surgery on a patient 11132 on a patient bed 11133 using an endoscopic surgery system 11000. As shown, the endoscopic surgery system 11000 is composed of an endoscope 11100, another surgical tool 11110 such as a pneumoperitoneum tube 11111 and an energy treatment tool 11112, a support arm device 11120 that supports the endoscope 11100, and a cart 11200 in which various devices for endoscopic surgery are mounted.

The endoscope 11100 is composed of a lens barrel 11101 in which a region having a predetermined length from the tip is inserted into the body cavity of the patient 11132 and a camera head 11102 connected to the base end of the lens barrel 11101. In the shown example, the endoscope 11100 configured as a so-called rigid endoscope having the rigid lens barrel 11101 is shown, but the endoscope 11100 may be configured as a so-called soft endoscope having a soft lens barrel.

An opening into which an objective lens is fitted is provided at the tip of the lens barrel 11101. A light source device 11203 is connected to the endoscope 11100, and light generated by the light source device 11203 is guided to the tip of the lens barrel by the light guide extending inside the lens barrel 11101, and emitted to an observation target in the body cavity of the patient 11132 via the objective lens. Here, the endoscope 11100 may be a direct endoscope or may be a perspective endoscope or a side endoscope.

An optical system and an imaging element are provided inside the camera head 11102, and reflected light (observation light) from the observation target is condensed on the imaging element by the optical system. The observation light is photoelectrically converted by the imaging element, and an electrical signal corresponding to the observation light, that is, an image signal corresponding to the observation image is generated. The image signal is transmitted as RAW data to a camera control unit (CCU) 11201.

The CCU 11201 is composed of a central processing unit (CPU), a graphics processing unit (GPU) or the like, and comprehensively controls the operation of the endoscope 11100 and a display device 11202. In addition, the CCU 11201 receives an image signal from the camera head 11102, and performs various types of image processing for displaying an image based on the image signal, for example, development processing (demosaic processing) on the image signal.

The display device 11202 displays an image based on the image signal on which image processing is performed by the CCU 11201 according to the control from the CCU 11201.

The light source device 11203 is composed of, for example, a light source such as a light emitting diode (LED), and supplies irradiation light when a surgical part or the like is imaged to the endoscope 11100.

An input device 11204 is an input interface for the endoscopic surgery system 11000. A user can input various types of information and input an instruction to the endoscopic surgery system 11000 via the input device 11204. For example, the user inputs an instruction to change imaging conditions (the type of irradiation light, a magnification, a focal distance and the like) and the like by the endoscope 11100.

A treatment tool control device 11205 controls driving of the energy treatment tool 11112 for tissue cauterization, incision or blood vessel sealing. In order to secure a field of view of the endoscope 11100 and secure an operation space of the surgeon, a pneumoperitoneum device 11206 sends a gas into a body cavity via the pneumoperitoneum tube 11111 in order to inflate the body cavity of the patient 11132. A recorder 11207 is a device that can record various types of information related to surgery. A printer 11208 is a device that can print various types of information related to surgery in various formats such as text, images and graphs.

Here, the light source device 11203 that supplies irradiation light when a surgical part is imaged to the endoscope 11100 can be composed of, for example, an LED, a laser light source or a white light source composed of a combination thereof. When a white light source is composed of a combination of RGB laser light sources, since the output intensity of each color (each wavelength) and the output timing can be controlled with high accuracy, white balance of the captured image can be adjusted in the light source device 11203. In addition, in this case, laser light from each of the RGB laser light sources is emitted to the observation target in a time-division manner, driving of the imaging element of the camera head 11102 is controlled in synchronization with the emission timing, and thus an image corresponding to each RGB can be captured in a time-division manner. According to the method, a color image can be obtained without providing a color filter in the imaging element.

In addition, driving of the light source device 11203 may be controlled so that the intensity of the output light changes at predetermined times. When driving of the imaging element of the camera head 11102 is controlled in synchronization with the timing of the change in the light intensity, an image is acquired in a time-division manner, and the image is synthesized, a so-called image in a high dynamic range without underexposure or overexposure can be generated.

In addition, the light source device 11203 may have a configuration in which light in a predetermined wavelength band corresponding to special light observation can be supplied. In the special light observation, for example, by emitting light in a narrower band than irradiation light (that is, white light) during normal observation using wavelength dependence of light absorption in a body tissue, so-called narrow band light observation (narrow band imaging) in which a predetermined tissue such as a blood vessel in the mucous membrane surface layer is imaged with a high contrast is performed. Alternatively, in the special light observation, fluorescence observation in which an image is obtained by fluorescence generated by emitting excitation light may be performed. The fluorescence observation can be performed by emitting excitation light to a body tissue, and observing fluorescence from the body tissue (autofluorescence observation), or locally injecting a reagent such as indocyanine green (ICG) to a body tissue, and emitting excitation light corresponding to a fluorescence wavelength of the reagent to the body tissue to obtain a fluorescence image. The light source device 11203 can supply narrow band light and/or excitation light corresponding to such special light observation.

Figure 31:
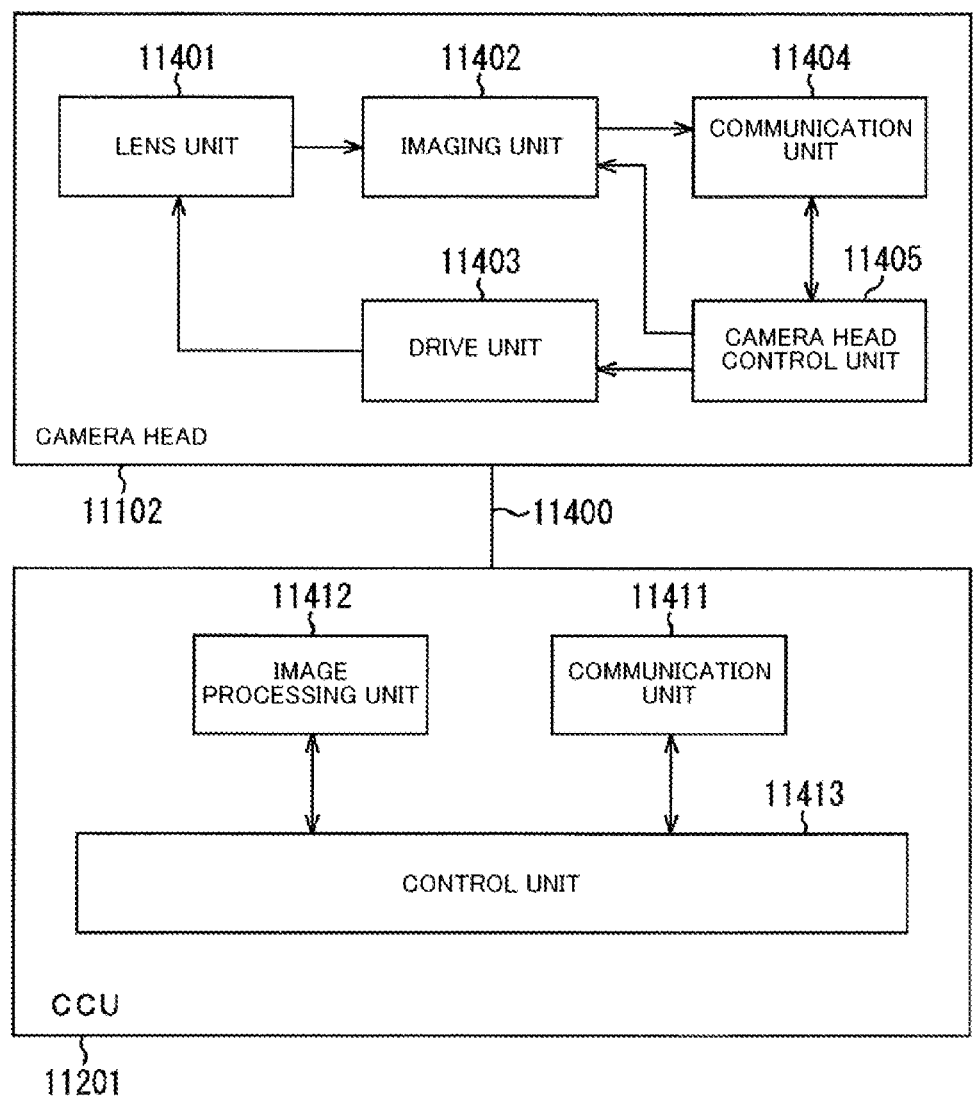
FIG. 31 is a block diagram showing an example of a functional configuration of a camera head and a CCU.

FIG. 31 is a block diagram showing an example of a functional configuration of the camera head 11102 and the CCU 11201 shown in FIG. 30.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are connected to each other via a transmission cable 11400 so that they can communicate with each other.

The lens unit 11401 is an optical system provided at the connection part with respect to the lens barrel 11101. Observation light taken from the tip of the lens barrel 11101 is guided to the camera head 11102 and enters the lens unit 11401. The lens unit 11401 is composed of a combination of a plurality of lenses including a zoom lens and a focus lens.

The imaging unit 11402 is composed of an imaging element. The imaging element constituting the imaging unit 11402 may be one element (so-called single plate type) or a plurality of elements (so-called multi-plate type). When the imaging unit 11402 is composed of a multi-plate type, for example, image signals corresponding to RGBs are generated by the imaging elements, and synthesized, and thereby a color image may be obtained. Alternatively, the imaging unit 11402 may include a pair of imaging elements for acquiring image signals for the right eye and the left eye corresponding to 3D (dimensional) display. When 3D display is performed, the surgeon 11131 can determine the depth of biological tissues in the surgical part more accurately. Here, when the imaging unit 11402 is composed of a multi-plate type, a plurality of lens units 11401 may be provided according to the imaging elements.

In addition, the imaging unit 11402 need not necessarily be provided in the camera head 11102. For example, the imaging unit 11402 may be provided inside the lens barrel 11101, immediately after the objective lens.

The drive unit 11403 is composed of an actuator, and moves the zoom lens and the focus lens of the lens unit 11401 along the optical axis by a predetermined distance according to the control from the camera head control unit 11405. Thereby, the magnification and the focus of the image captured by the imaging unit 11402 can be appropriately adjusted.

The communication unit 11404 is composed of a communication device for transmitting and receiving various types of information to and from the CCU 11201. The communication unit 11404 transmits the image signal obtained from the imaging unit 11402 as RAW data to the CCU 11201 via the transmission cable 11400.

In addition, the communication unit 11404 receives a control signal for controlling driving of the camera head 11102 from the CCU 11201 and supplies it to the camera head control unit 11405. The control signal includes information related to imaging conditions, for example, information specifying a frame rate of a captured image, information specifying an exposure value during imaging, and/or information specifying a magnification and a focus of a captured image.

Here, imaging conditions such as a frame rate, an exposure value, a magnification, and a focus may be appropriately specified by the user, or may be automatically set by the control unit 11413 of the CCU 11201 based on the acquired image signal. In the latter case, a so-called auto exposure (AE) function, auto focus (AF) function and auto white balance (AWB) function are provided in the endoscope 11100.

The camera head control unit 11405 controls driving of the camera head 11102 based on the control signal received from the CCU 11201 via the communication unit 11404.

The communication unit 11411 is composed of a communication device for transmitting and receiving various types of information to and from the camera head 11102. The communication unit 11411 receives the image signal transmitted from the camera head 11102 via the transmission cable 11400.

In addition, the communication unit 11411 transmits a control signal for controlling driving of the camera head 11102 to the camera head 11102. The image signal and the control signal can be transmitted through telecommunication, optical communication or the like.

The image processing unit 11412 performs various types of image processing on the image signal, which is RAW data transmitted from the camera head 11102.

The control unit 11413 performs various controls related to imaging of a surgical part and the like with the endoscope 11100 and displaying of the captured image obtained by imaging a surgical part and the like. For example, the control unit 11413 generates a control signal for controlling driving of the camera head 11102.

In addition, the control unit 11413 causes the display device 11202 to display a captured image showing the surgical part and the like based on the image signal on which image processing is performed by the image processing unit 11412. In this case, the control unit 11413 may recognize various objects in the captured image using various image recognition technologies. For example, the control unit 11413 can recognize surgical tools such as forceps, specific biological parts, bleeding, mist when the energy treatment tool 11112 is used and the like by detecting the edge shape and color of the object included in the captured image. When the control unit 11413 causes the display device 11202 to display the captured image, it may cause various types of surgical support information to be superimposed and displayed with the image of the surgical part using the recognition result. When the surgical support information is superimposed and displayed, and presented to the surgeon 11131, it is possible to reduce the burden on the surgeon 11131 and the surgeon 11131 can reliably proceed the surgery.

The transmission cable 11400 connecting the camera head 11102 and the CCU 11201 is an electrical signal cable supporting electrical signal communication, an optical fiber supporting optical communication, or a composite cable thereof.

Here, in the shown example, communication is performed using the transmission cable 11400 in a wired manner, but communication between the camera head 11102 and the CCU 11201 may be performed in a wireless manner.

An example of the endoscopic surgery system to which the technology according to the present disclosure can be applied has been described above. The technology according to the present disclosure can be applied to the imaging unit 11402 within the configuration described above. Specifically, the image sensor in FIG. 21 and FIG. 22 can be applied to the imaging unit 11402. When the technology according to the present disclosure is applied to the imaging unit 11402, since deterioration of the performance of the capacitor due to the bonding process can be minimized, a clearer surgical part image can be obtained, and the surgeon can reliably confirm the surgical part.

While the endoscopic surgery system has been described here as an example, the technology according to the present disclosure may be applied to other systems, for example, a microscopic surgery system.

In addition, the present technology may have the following configuration.

(1)
A semiconductor device, including
a first substrate;
a second substrate bonded to the first substrate;
a first electrode which is provided in the first substrate and of which one surface is positioned on the same surface as a bonding surface between the first substrate and the second substrate;
a second electrode which is provided in the second substrate and of which one surface is positioned on the same surface as the bonding surface and bonded to one surface of the first electrode; and
at least one of a first capacitor which is provided in the first substrate and of which one electrode is electrically connected to the other surface of the first electrode and a second capacitor which is provided in the second substrate and of which one electrode is electrically connected to the other surface of the second electrode.

(2)
The semiconductor device according to (1),
wherein the first electrode and the second electrode are copper electrodes made of pure copper or copper alloy.

(3)
The semiconductor device according to (1) or (2),
wherein the first electrode includes a first electrode pad of which one surface is positioned on the same surface as the bonding surface and a first via extending from the other surface of the first electrode pad, and
wherein the second electrode includes a second electrode pad of which one surface is positioned on the same surface as the bonding surface and a second via extending from the other surface of the second electrode pad.

(4)
The semiconductor device according to any one of (1) to (3), wherein a plurality of each of the first electrodes and the second electrodes are provided,
wherein a plurality of at least one of first capacitors and second capacitors are provided, and
wherein two or more of the plurality of first capacitors or two or more of the plurality of second capacitors are electrically connected to the same wiring.

(5)
The semiconductor device according to any one of (1) to (4),
wherein at least one of the first capacitor and the second capacitor includes two electrodes that face each other and an insulating film arranged between the two electrodes.

(6)
The semiconductor device according to any one of (1) to (4),
wherein at least one of the first capacitor and the second capacitor forms a multilayer structure in which the electrode and the insulating film are alternately and repeatedly arranged.

(7)
The semiconductor device according to any one of (1) to (4),
wherein at least one of the first capacitor and the second capacitor includes a bottom part and a side wall part extending from an edge part of the bottom part in a direction intersecting the bottom part.

(8)
The semiconductor device according to any one of (1) to (7),
wherein the material of the electrode of the first capacitor and the second capacitor is tantalum, tantalum nitride, titanium, titanium nitride, tungsten nitride, zirconium nitride or cobalt.

(9)
The semiconductor device according to any one of (1) to (8),
wherein an insulating film of the first capacitor and the second capacitor is a single-layer film composed of any of tantalum oxide, hafnium oxide, aluminum oxide, silicon nitride and zirconium oxide, or a multilayer film formed by combining these.

(10)
A solid-state imaging device, including:
a sensor substrate in which a plurality of photoelectric conversion units are arranged;
a logic substrate which is bonded to the sensor substrate and in which a circuit that processes an electrical signal from the photoelectric conversion unit is integrated;
a first electrode which is provided in the sensor substrate and of which one surface is positioned on the same surface as a bonding surface between the sensor substrate and the logic substrate;
a second electrode which is provided in the logic substrate and of which one surface is positioned on the same surface as the bonding surface and bonded to one surface of the first electrode; and
at least one of a first capacitor which is provided in the sensor substrate and of which one electrode is electrically connected to the other surface of the first electrode and a second capacitor which is provided in the logic substrate and of which one electrode is electrically connected to the other surface of the second electrode.

(11)
The solid-state imaging device according to (10),
wherein at least one of the first capacitor and the second capacitor constitutes a charge accumulated capacitance part for accumulating a signal charge generated by the photoelectric conversion unit when a global shutter operation is executed.

(12)
An electronic device, including
a solid-state imaging device including a sensor substrate in which a plurality of photoelectric conversion units are arranged, a logic substrate which is bonded to the sensor substrate and in which a circuit that processes an electrical signal from the photoelectric conversion unit is integrated, a first electrode which is provided in the sensor substrate and of which one surface is positioned on the same surface as a bonding surface between the sensor substrate and the logic substrate, a second electrode which is provided in the logic substrate and of which one surface is positioned on the same surface as the bonding surface and bonded to one surface of the first electrode, and at least one of a first capacitor which is provided in the sensor substrate and of which one electrode is electrically connected to the other surface of the first electrode and a second capacitor which is provided in the logic substrate and of which one electrode is electrically connected to the other surface of the second electrode;
an optical lens that forms image light from a subject into an image on an imaging surface of the solid-state imaging device; and
a signal processing circuit that performs signal processing on a signal output from the solid-state imaging device.

REFERENCE SIGNS LIST

1 Semiconductor device
2 First substrate
3 Second substrate
4 Interlayer insulating film
5a First wiring layer
5b Second wiring layer
5c Third wiring layer
5d Fourth wiring layer
6 Interlayer insulating film
7, 7a, 7b First electrode
8 First electrode pad
9 First via
10 First capacitor
11 Electrode
12 Electrode
13 Insulating film
14 Interlayer insulating film
15a First wiring layer
15b Second wiring layer
15c Third wiring layer
15d Fourth wiring layer
15e Fifth wiring layer
15f Sixth wiring layer
16 Interlayer insulating film
17, 17a, 17b Second electrode
18 Second electrode pad
19 Second via
20 Second capacitor
21 Electrode
22 Electrode
23 Insulating film
24 Region for substrate connection
25 Pixel region
26 I/O unit
27 Driver
28, 29 Insulating film
30, 30a to 30e Electrode
31, 32 Insulating film
33 Bottom part
34, 35 Side wall part
36 Color filter
37 Micro lens

The invention claimed is:
1. A semiconductor device, comprising:
a first substrate that includes a top surface and a bottom surface;
a second substrate that includes a top surface and a bottom surface, wherein the top surface of the second substrate is bonded to the bottom surface of the first substrate;
a first electrode in the first substrate, wherein
the first electrode includes a top surface and a bottom surface, and
the bottom surface of the first electrode is on the bottom surface of the first substrate;
a second electrode in the second substrate, wherein
the second electrode includes a top surface and a bottom surface,
the top surface of the second electrode is in contact with the top surface of the second substrate, and
the second electrode is bonded to the bottom surface of the first electrode;
a first capacitor in contact with the top surface of the first substrate, wherein the first capacitor includes an electrode that is electrically connected to the top surface of the first electrode; and
a second capacitor in contact with the bottom surface of the second substrate, wherein the second capacitor includes an electrode that is electrically connected to the top surface of the second electrode.
2. The semiconductor device according to claim 1, wherein the first electrode and the second electrode are copper electrodes that include one of pure copper or copper alloy.
3. The semiconductor device according to claim 1, wherein
the first electrode further includes a first electrode pad that includes a top surface and a bottom surface,
the bottom surface of the first electrode pad is on the bottom surface of the first substrate,
a first via extends from the top surface of the first electrode pad,
the second electrode further includes a second electrode pad that includes a top surface and a bottom surface,
the top surface of the second electrode pad is in contact with the top surface of the second substrate, and
a second via extends from the bottom surface of the second electrode pad.
4. The semiconductor device according to claim 1, further comprising:
a plurality of first electrodes and a plurality of second electrodes, wherein
the plurality of first electrodes includes the first electrode, and
the plurality of second electrodes includes the second electrode; and
a plurality of first capacitors and a plurality of second capacitors, wherein
the plurality of first capacitors includes the first capacitor,
the plurality of second capacitors includes the second capacitor, and one of at least two of the plurality of first capacitors or at least two of the plurality of second capacitors are electrically connected to a same wiring.

5. The semiconductor device according to claim 1, wherein at least one of the first capacitor or the second capacitor further includes two electrodes with an insulating film between the two electrodes.

6. The semiconductor device according to claim 1, wherein at least one of the first capacitor or the second capacitor further includes a multilayer structure in which an electrode and an insulating film are alternately and repeatedly arranged.

7. The semiconductor device according to claim 1, wherein at least one of the first capacitor or the second capacitor further includes a bottom part and a side wall part that extends from an edge part of the bottom part in a direction that intersects the bottom part.

8. The semiconductor device according to claim 1, wherein a material of each of the electrode of the first capacitor and the electrode of the second capacitor is one of tantalum, tantalum nitride, titanium, titanium nitride, tungsten nitride, zirconium nitride, or cobalt.

9. The semiconductor device according to claim 1, wherein an insulating film of the first capacitor and the second capacitor includes one of
a single-layer film that includes at least one of tantalum oxide, hafnium oxide, aluminum oxide, silicon nitride, or zirconium oxide, or
a multilayer film that includes a combination of two or more materials selected from the group consisting of tantalum oxide, hafnium oxide, aluminum oxide, silicon nitride, and zirconium oxide.

10. A solid-state imaging device, comprising:
a sensor substrate which includes a plurality of photoelectric conversion units, a top surface, and a bottom surface;
a logic substrate that includes a top surface and a bottom surface, wherein
the top surface of the logic substrate is bonded to the bottom surface of the sensor substrate, and
the logic substrate further includes a circuit configured to process electrical signals from the plurality of photoelectric conversion units;
a first electrode in the sensor substrate, wherein
the first electrode includes a top surface and a bottom surface, and
the bottom surface of the first electrode is on the bottom surface of the sensor substrate;
a second electrode in the logic substrate, wherein
the second electrode includes a top surface and a bottom surface,
the top surface of the second electrode is in contact with the top surface of the logic substrate, and
the second electrode is bonded to the bottom surface of the first electrode; and
a first capacitor in contact with the top surface of the sensor substrate, wherein the first capacitor includes an electrode that is electrically connected to the top surface of the first electrode; and
a second capacitor in contact with the bottom surface of the logic substrate, wherein the second capacitor includes an electrode that is electrically connected to the top surface of the second electrode.

11. The solid-state imaging device according to claim 10, wherein at least one of the first capacitor or the second capacitor constitutes a charge accumulated capacitance part that accumulates signal charge generated by the plurality of photoelectric conversion units in case of execution of a global shutter operation.

12. An electronic device, comprising:
a solid-state imaging device including
a sensor substrate which includes a plurality of photoelectric conversion units a top surface, and a bottom surface,
a logic substrate that includes a top surface and a bottom surface, wherein
the top surface of the logic substrate is bonded to the bottom surface of the sensor substrate, and
the logic substrate further includes a circuit configured to process electrical signals from the plurality of photoelectric conversion units,
a first electrode in the sensor substrate, wherein
the first electrode includes a top surface and a bottom surface, and
the bottom surface of the first electrode is on the bottom surface of the sensor substrate,
a second electrode in the logic substrate, wherein
the second electrode includes a top surface and a bottom surface, and
the top surface of the second electrode is in contact with the top surface of the logic substrate,
a first capacitor in contact with the top surface of the sensor substrate, wherein the first capacitor includes an electrode that is electrically connected to the top surface of the first electrode, and
a second capacitor in contact with the bottom surface of the logic substrate, wherein the second capacitor includes an electrode that is electrically connected to the top surface of the second electrode;
an optical lens configured to form image light from a subject into an image on an imaging surface of the solid-state imaging device; and
a signal processing circuit configured to execute a signal processing operation on a signal output from the solid-state imaging device.

* * * * *